US012469678B2

(12) United States Patent
Uhm et al.

(10) Patent No.: US 12,469,678 B2
(45) Date of Patent: Nov. 11, 2025

(54) PLASMA PROCESS SYSTEM FOR MULTI-STATION

(71) Applicant: EN2CORE TECHNOLOGY, INC., Daejeon (KR)

(72) Inventors: Sae Hoon Uhm, Hwaseong-si (KR); Dong Jegal, Yongin-si (KR); Yeonghoon Sohn, Daejeon (KR); Gyueng Hyuen Choe, Chungcheongbuk-do (KR); Se Hong Park, Daejeon (KR); Jin Huh, Daejeon (KR)

(73) Assignee: EN2CORE TECHNOLOGY, INC., Daejeon (KR)

( * ) Notice: Subject to any disclaimer, the term of this patent is extended or adjusted under 35 U.S.C. 154(b) by 0 days.

(21) Appl. No.: 18/548,754

(22) PCT Filed: Dec. 28, 2022

(86) PCT No.: PCT/KR2022/021551
§ 371 (c)(1),
(2) Date: Sep. 1, 2023

(87) PCT Pub. No.: WO2023/128627
PCT Pub. Date: Jul. 6, 2023

(65) Prior Publication Data
US 2024/0162006 A1 May 16, 2024

(30) Foreign Application Priority Data
Dec. 31, 2021 (KR) ........................ 10-2021-0193985

(51) Int. Cl.
*H01J 37/32* (2006.01)

(52) U.S. Cl.
CPC ..... *H01J 37/32165* (2013.01); *H01J 37/3211* (2013.01); *H01J 37/32467* (2013.01);
(Continued)

(58) Field of Classification Search
CPC ............. H01J 37/32165; H01J 37/3211; H01J 37/32467; H01J 37/32743; H01J 2237/24564; H01J 2237/327
See application file for complete search history.

(56) References Cited

U.S. PATENT DOCUMENTS 10,186,402 B2 1/2019 Kamata et al.
10,790,110 B2 * 9/2020 Ogasawara ............ H05G 2/001
(Continued)

FOREIGN PATENT DOCUMENTS

CN 107430976 A 12/2017
CN 111933509 A 11/2020
(Continued)

OTHER PUBLICATIONS

International Search Report and Written Opinion for PCT/KR2022/021551, dated Apr. 7, 2023, 11 pages.
(Continued)

*Primary Examiner* — Adam D Houston
(74) *Attorney, Agent, or Firm* — Perkins Coie LLP

(57) ABSTRACT

According to one embodiment of the present disclosure, there can be provided a plasma processing system for multi-station, the system including a processing chamber including at least two or more stations, one plasma generator provided for each of the stations, one inverter provided for each of the plasma generators, a sensing unit configured to measure an electric characteristic of each of the plasma generators, and a controller configured to acquire sensing data from the sensing unit and control each of the inverters.

20 Claims, 17 Drawing Sheets

(52) U.S. Cl.
CPC .................... *H01J 37/32743* (2013.01); *H01J 2237/24564* (2013.01); *H01J 2237/327* (2013.01)

(56) References Cited

U.S. PATENT DOCUMENTS

| | | | | |
|---|---|---|---|---|
| 11,195,697 | B2 * | 12/2021 | Hayami | H01J 37/32174 |
| 11,830,751 | B2 * | 11/2023 | Matsuyama | H01L 21/3065 |
| 11,862,436 | B2 * | 1/2024 | Fujii | H01J 37/32449 |
| 2004/0261946 | A1 * | 12/2004 | Endoh | H01J 37/32642 156/345.1 |
| 2005/0061442 | A1 * | 3/2005 | Higashiura | H01J 37/32174 156/345.43 |
| 2007/0080140 | A1 | 4/2007 | Hoffman et al. | |
| 2010/0194279 | A1 | 8/2010 | Barroso et al. | |
| 2014/0361690 | A1 * | 12/2014 | Yamada | H01J 37/32183 315/111.21 |
| 2014/0370715 | A1 | 12/2014 | Chung et al. | |
| 2015/0122985 | A1 * | 5/2015 | Ristroph | H01J 49/0054 250/281 |
| 2016/0056017 | A1 | 2/2016 | Kim et al. | |
| 2017/0365907 | A1 | 12/2017 | Kapoor et al. | |
| 2018/0068835 | A1 * | 3/2018 | Satake | C23C 16/52 |
| 2018/0374680 | A1 * | 12/2018 | Ikeda | H01L 21/67739 |
| 2019/0108976 | A1 * | 4/2019 | Van Zyl | H01J 37/32146 |
| 2021/0090962 | A1 | 3/2021 | Kapoor et al. | |

FOREIGN PATENT DOCUMENTS

| | | | | |
|---|---|---|---|---|
| CN | 111758145 | B * | 6/2024 | C23C 16/45536 |
| JP | 4764841 | B2 | 9/2011 | |
| JP | 2016092076 | A | 5/2016 | |
| KR | 10-2010-0053531 | A | 5/2010 | |
| KR | 10-2014-0139621 | A | 12/2014 | |
| TW | 201401939 | A | 1/2014 | |
| TW | I436420 | B | 5/2014 | |
| TW | 201633360 | A | 9/2016 | |
| TW | 201732857 | A | 9/2017 | |
| TW | 201841183 | A | 11/2018 | |
| TW | 201935596 | A | 9/2019 | |
| TW | 202018886 | A | 5/2020 | |
| WO | 2016113707 | A1 | 7/2016 | |
| WO | 2021042170 | A1 | 3/2021 | |
| WO | 2021225411 | A1 | 11/2021 | |
| WO | WO-2023128627 | A1 * | 7/2023 | H01J 37/321 |

OTHER PUBLICATIONS

European Search Report of EP Patent Application No. 22916768.9 issued on Sep. 30, 2024, 11 pages.

Park, Se-Hong , et al., "SiC-Based 4 MHz 10kW ZVS Inverter With Fast Resonance Frequency Tracking Control for High-Density Plasma Generators", IEEE Transactions on Power Electronics, vol. 35, No. 3, Mar. 2020, 10 pages.

International Search Report and Written Opinion from PCT Application No. PCT/KR2022/021551 dated Apr. 7, 2023.

Office Action (including a search report) from TW Patent Application No. 111150646 dated Oct. 11, 2023.

Office Action of TW Patent Application No. 113113193 dated Apr. 18, 2025, 6 pages.

* cited by examiner

| phase difference | Pset-Pmea | Frequency change or not | Frequency variance(df) |
|---|---|---|---|
| 0 | (+) | Maintain frequency | df =0 |
| | 0 | Maintain frequency | df =0 |
| | (-) | Increase frequency | df = abs(Pset-Pmea)/Pset * 1000 |
| (+) | (+) | Decrease frequency | df = -abs(Pset-Pmea)/Pset * 1000 |
| | 0 | Maintain frequency | df =0 |
| | (-) | Increase frequency | df =abs($P_{set}$-$P_{mea}$)/Pset * 1000 |
| (-) | (+) | Increase frequency until phase difference is larger than 0 | df = Fixed value |
| | 0 | | |
| | (-) | | |

*FIG. 17*

PLASMA PROCESS SYSTEM FOR MULTI-STATION

CROSS-REFERENCE TO RELATED APPLICATION

This present application is a 371 of International Application No. PCT/KR2022/021551, filed Dec. 28, 2022, which claims Paris Convention priority of Korean Patent Application No. 10-2021-0193985, filed Dec. 31, 2021 the entire content of which is incorporated herein by reference.

BACKGROUND OF THE INVENTION

Field of the Invention

The present disclosure relates to a system of plasma processing for a multi-station, in more detail, a system for performing a plasma process at a plurality of stations.

Description of the Related Art

A plasma processing technology that uses plasma is used in various industrial fields including not only the fields of semiconductor, display, and medical equipment, but environment technology fields such as purification of air, water, and soil and energy technology fields such as solar cells and hydrogen energy. In a plasma processing technology, there are various methods of generating plasma including DC discharge such as corona discharge, glow discharge, and arc discharge, AC discharge such as capacitively coupled discharge and inductively coupled discharge, and methods of using a shock wave, a high-energy beam, etc., and, of these methods, inductively coupled discharge that can generate high-density plasma using less power is being spotlighted.

As a plasma processing technology using inductively coupled discharge, there are a method of directly generating plasma in a processing chamber and a remote plasma method that produces a process gas (ex. radical) required for processes and supplies the produced process gas into a chamber.

Meanwhile, the remote plasma method of the related art generally performs one kind of plasma processing in one processing chamber, and accordingly, it is difficult to simultaneously perform a plurality of same processes or to perform different processes in parallel, and as a result, there is a problem that there is limitation in improving the entire process efficiency.

A system of plasma processing that uses a multi-station to solve this problem will be described hereafter in the specification.

SUMMARY OF THE INVENTION

Problems to be Solved

An objective of the present disclosure is to provide a system of plasma processing for a multi-station.

An objective of the present disclosure is to provide a physical structure in which a plasma generation system and a processing chamber are connected to each other in a system of plasma processing for a multi-station.

An objective of the present disclosure is to provide a method of controlling a plasma generation system in a system of plasma processing for a multi-station, and an apparatus for the method.

Objectives of the present disclosure are not limited to those described above and objectives not stated above will be clearly understood to those skilled in the art from the specification and the accompanying drawings.

Solutions for Problems

According to an embodiment of the present disclosure, there can be provided a system of plasma processing for multi-station, the system including a processing chamber including a first station and a second station; a first plasma generator fluidically coupled to the first station; a first inverter configured to provide AC power to the first plasma generator; a first sensing unit configured to sense electric characteristic of the first plasma generator; a second plasma generator coupled to the second station; a second inverter configured to provide AC power to the second plasma generator; a second sensing unit configured to sense electric characteristic of the second plasma generator; a controller configured to control the first inverter and the second inverter, wherein the first plasma generator includes a first discharge tube fluidically coupled to the first station and a first antenna structure placed to surround the first discharge tube, wherein the second plasma generator includes a second discharge tube fluidically coupled to the second station and a second antenna structure placed to surround the second discharge tube, wherein the first antenna structure is configured to receive AC power from the first inverter and induce plasma inside the first discharge tube, and wherein the second antenna structure is configured to receive AC power from the second inverter and induce plasma inside the second discharge tube.

Objectives of the present disclosure are not limited to those described above and objectives not stated above will be clearly understood to those skilled in the art from the specification and the accompanying drawings.

Effects of Invention

According to an embodiment of the present disclosure, a remote plasma processing system for a multi-station can be provided.

According to an embodiment of the present disclosure, it is possible to perform a plurality of processes in parallel using a multi-station in plasma processing.

According to an embodiment of the present disclosure, it is possible to perform different processes in parallel using a multi-station in plasma processing.

According to an embodiment of the present disclosure, it is possible to implement a system for plasma processing having high process efficiency.

Effects of the present disclosure are not limited to those described above and effects not stated above will be clearly understood to those skilled in the art from the specification and the accompanying drawings.

BRIEF DESCRIPTION OF THE DRAWINGS

FIG. 17 is a view showing a table summarizing rules used in the power control method through frequency control according to an embodiment of the present disclosure.

DETAILED DESCRIPTION OF THE INVENTION

Figure 1:
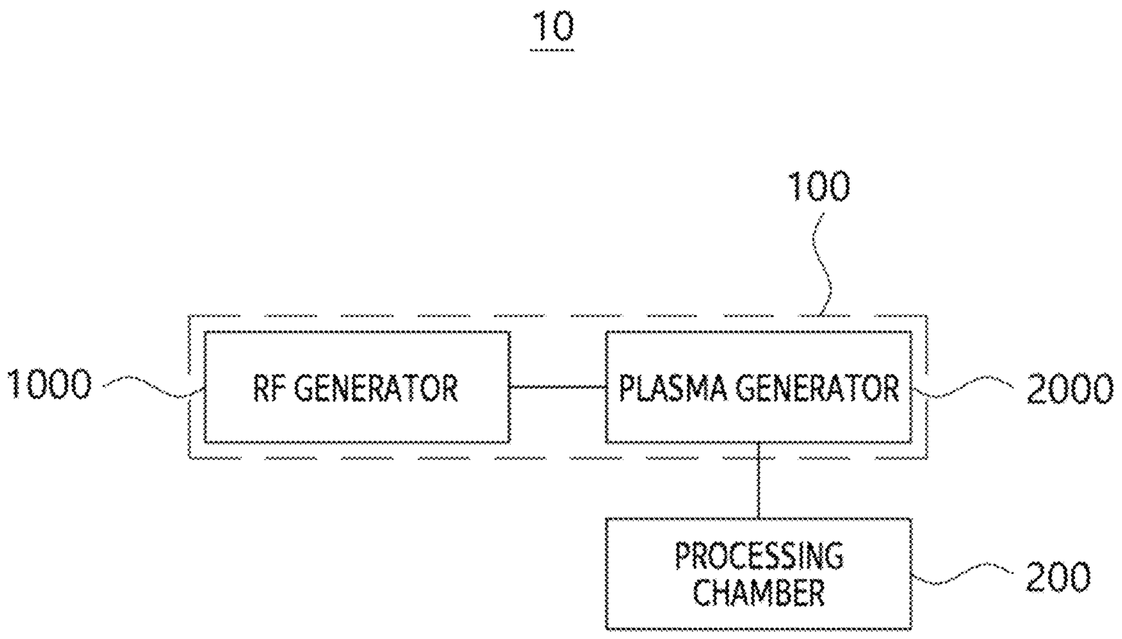
FIG. 1 is a view showing a system of plasma processing according to an embodiment of the present disclosure.

The objectives, features, and advantages of the present disclosure will be made clearer through the following detailed description related to the accompanying drawings. The present disclosure may be modified in various ways and implemented by various exemplary embodiments, so that specific exemplary embodiments are shown in the drawings and will be described in detail hereafter.

In the drawings, the thicknesses of layers and regions are exaggerated for clarity, and when a component or a layer is “on” another component or layer, it includes all cases in which the component or layer is not only on another component or layer and another layer or component is disposed therebetween. Like reference numerals fundamentally indicate the same components throughout the specification. Components having the same functions within the same scopes in drawings of embodiments are described with the same reference numerals, and repeated description thereof is omitted.

Numbers (e.g., first, second, etc.) used in the description of the present disclosure are only identification symbols to discriminate one component from another component.

Terms “module” and “unit” that are used for components in the following embodiments are used only for the convenience of description without having discriminate meanings or functions.

In the following embodiments, singular forms are intended to include plural forms unless the context clearly indicates otherwise.

In the following embodiments, terms such as “include” or “have” mean that the features or components described herein exist without excluding the possibility that one or more other features or components are added.

Components may be exaggerated or reduced in size for the convenience of description. For example, the sizes and thicknesses of the components shown the figures are selectively provided and the present disclosure is not necessarily limited thereto.

When an embodiment can be implemented in another way, specific processes may be performed in order different from the description. For example, two sequentially described processes may be substantially simultaneously performed or may be performed in the reverse order of the described order.

In the following embodiments, when films, regions, components are connected, it includes not only the case in which the films, the regions, and the components are directly connected, but the case in which the films, the regions, and the components are indirectly connected with other films, regions, and components therebetween.

For example, in the specification, when films, regions, and components are electrically connected, it includes not only the case in which the films, regions, and components are directly electrically connected, but the case in which the films, regions, and components are indirectly electrically connected with another film, region, and component therebetween.

According to one embodiment, there can be provided a system for plasma processing for multi-station, the system comprising: a processing chamber including a first station and a second station; a first plasma generator coupled to the first station; a first inverter configured to provide AC power to the first plasma generator; a first sensing unit configured to sense electric characteristic related to the first plasma generator; a second plasma generator coupled to the second station; a second inverter configured to provide AC power to the second plasma generator; a second sensing unit configured to sense electric characteristic related to the second plasma generator; and a controller configured to control the first inverter and the second inverter, wherein the first plasma generator includes a first discharge tube fluidically coupled to the first station and a first antenna structure placed to surround the first discharge tube, wherein the second plasma generator includes a second discharge tube fluidically coupled to the second station and a second antenna structure placed to surround the second discharge tube, wherein the first antenna structure is configured to receive AC power from the first inverter and induce plasma inside the first discharge tube, and wherein the second antenna structure is configured to receive AC power from the second inverter and induce plasma inside the second discharge tube.

The controller is configured to provide a first switch signal corresponding to a first driving frequency to the first inverter based on first sensing data obtained from the first sensing unit, and provide a second switch signal corresponding to a second driving frequency to the second inverter based on second sensing data obtained from the second sensing unit.

The controller is configured to receive third sensing data after receiving the first sensing data, determine whether to change the first switch signal provided to the first inverter based on the third sensing data, receive fourth sensing data after receiving the second sensing data, determine whether to change the second switch signal provided to the second inverter based on the fourth sensing data.

The controller is configured to obtain first phase difference data and first power comparison data by using the third sensing data, determine whether to change the first switch signal provided to the first inverter by using the first phase difference data and the first power comparison data, wherein the first phase difference data corresponds to phase difference between voltage and current applied to the first plasma generator, and wherein the first power comparison data corresponds to difference between first power applied to the first inverter and first target power.

The controller is configured to provide a third switch signal corresponding to a third driving frequency smaller than the first driving frequency to the first inverter, when the first phase difference data indicates lagging state and the first power comparison data indicates that the first power is smaller than the first target power.

Difference between the first driving frequency and the third driving frequency is determined based on the first target power.

The controller is configured to maintain the first switch signal applied to the first inverter, when the first phase difference data indicates lagging state and the first power comparison data indicates that the first power is same with the first target power.

The controller is configured to provide a third switch signal corresponding to a third driving frequency bigger than the first driving frequency to the first inverter, when the first phase difference data indicates lagging state and the first power comparison data indicates that the first power is bigger than the first target power.

Difference between the first driving frequency and the third driving frequency is determined based on the first target power.

The controller is configured to provide a third switch signal corresponding to a third driving frequency bigger than the first driving frequency to the first inverter, when the first phase difference data indicates leading state.

Difference between the first driving frequency and the third driving frequency is a fixed value.

The first sensing unit is configured to acquire the first sensing data at a predetermined period and provide the first sensing data to the controller, wherein the second sensing unit is configured to acquire the second sensing data at a predetermined period and provide the second sensing data to the controller, and wherein the controller is configured to change the first switch signal provided to the first inverter based on the first sensing data obtained periodically, such that a frequency of AC power provided to the first plasma generator becomes a third driving frequency from the first driving frequency, and change the second switch signal provided to the second inverter based on the second sensing data obtained periodically, such that a frequency of AC power provided to the second plasma generator becomes a fourth driving frequency from the second driving frequency.

The controller is configured to obtain a first phase difference data representing a phase difference of a voltage and a current applied to the first plasma generator based on the first sensing data and the first switch signal, change the first switch signal provided to the first inverter when the first phase difference data does not satisfy a first allowable phase difference condition, obtain a second phase difference data representing a phase difference of a voltage and a current applied to the second plasma generator based on the second sensing data and the second switch signal, and change the second switch signal provided to the second inverter when the second phase difference data does not satisfy a second allowable phase difference condition.

The first sensing data corresponds to a phase of the current applied to the first plasma generator and the first switch signal corresponds to a phase of the voltage applied to the first plasma generator, and wherein the second sensing data corresponds to a phase of the current applied to the second plasma generator and the second switch signal corresponds to a phase of the voltage applied to the second plasma generator.

Further comprising a power distributor electrically coupled to the first inverter and the second inverter; wherein the power distributor is configured to provide first DC power to the first inverter and provide second DC power different in magnitude from the first DC power to the second inverter.

The first sensing unit may be configured to acquire the first sensing data at a predetermined period and provide the first sensing data to the controller, the second sensing unit may be configured to acquire the second sensing data at a predetermined period and provide the second sensing data to the controller, and the controller may be configured to: change the first switch signal provided to the first inverter based on the first sensing data obtained periodically, such that a frequency of AC power provided to the first plasma generator becomes a third driving frequency from the first driving frequency, and change the second switch signal provided to the second inverter based on the second sensing data obtained periodically, such that a frequency of AC power provided to the second plasma generator becomes a fourth driving frequency from the second driving frequency.

The controller may be configured to: obtain a first phase difference data representing a phase difference of a voltage and a current applied to the first plasma generator based on the first sensing data and the first switch signal, change the first switch signal provided to the first inverter when the first phase difference data does not satisfy a first allowable phase difference condition, obtain a second phase difference data representing a phase difference of a voltage and a current applied to the second plasma generator based on the second sensing data and the second switch signal, and change the second switch signal provided to the second inverter when the second phase difference data does not satisfy a second allowable phase difference condition.

The first sensing data may correspond to a phase of the current applied to the first plasma generator and the first switch signal may correspond a phase of the voltage applied to the first plasma generator; and the second sensing data may correspond a phase of the current applied to the second plasma generator and the second switch signal may correspond a phase of the voltage applied to the second plasma generator.

The controller may be configured to: control the first inverter based on first sensing data obtained from the first sensing unit such that a first AC power is applied to the first plasma generator, and control the second inverter based on second sensing data obtained from the second sensing unit such that a second AC power is applied to the second plasma generator.

The controller may be configured to: provide the first AC power to the first plasma generator by performing a first powering operation and a first freewheeling operation in a first pattern through the first inverter, wherein the first powering operation is that providing AC power to the first plasma generator and the first freewheeling operation is that not providing AC power to the first plasma generator, and provide the second AC power to the second plasma generator by performing a second powering operation and a second freewheeling operation in a second pattern through the second inverter, wherein the second powering operation is that providing AC power to the second plasma generator and the second freewheeling operation is that not providing AC power to the second plasma generator.

A ratio of the first freewheeling operation to the first powering operation in the first pattern may be different from a ratio of the second freewheeling operation to the second powering operation in the second pattern.

The first sensing data may correspond to an amount of power applied to the first inverter, and the second sensing data may correspond to an amount of power applied to the second inverter.

The controller may be configured to: determine whether the first sensing data satisfies a first allowable amount of power condition, and change the first AC power applied to the first plasma generator when the first sensing data does not satisfy the first allowable amount of power condition, and determine whether the second sensing data satisfies a second allowable amount of power condition, and change the second AC power applied to the second plasma generator when the second sensing data does not satisfy the second allowable amount of power condition, and wherein the first allowable amount of power condition and the second allowable amount of power condition may have different ranges.

1. Summary

(1) Terminologies

The present disclosure relates to a system of plasma processing using a multi-station, in more detail, a system for performing plasma processing at a multi-station using a plasma generation system.

In the specification, plasma processing, which is a process of generating plasma and using the generated plasma and is used in a semiconductor process, a display process, a nano process, environment improvement, etc. In the specification, as plasma processing, semiconductor processes such as plasma ashing, plasma chemical vapor deposition (CVD), plasma etching, sputtering, surface modification, etc. are described as main embodiments, but the technical ideas of the present disclosure are not limited thereto.

Plasma is a phase in which a substance has been decomposed into electrons having negative charge and ions having positive charge due to high energy applied thereto, and may be induced or generated in various ways. Inductively Coupled Plasma, which is plasma generated by an induced electric field or capacitive electric field formed in a specific space by power supplied to a coil or an antenna, generally may be driven by high-frequency power such as a Radio Frequency (RF). Meanwhile, it is assumed hereafter for the convenience of description that plasma that is generated by a plasma generation system is inductively coupled plasma, but the technical ideas of the present disclosure are not limited thereto.

In the specification a station, which is an environment for performing processes on an object, may include a space or a region in which processes are performed, or components for performing processes. Further, a multi-station means the case in which the station includes a plurality of stations.

(2) Summary of System of Plasma Processing

Hereafter, a system for plasma processing and the configuration thereof are described with reference to FIG. 1.

FIG. 1 is a view showing a plasma processing system 10 according to an embodiment of the present disclosure.

Referring to FIG. 1, the plasma processing system 10 may include a plasma generation system 100 and a processing chamber 200, and the plasma generation system 1000 may include an RF generator and a plasma generator 2000.

The RF generator 1000 can provide power to the plasma generator 2000. For example, the RF generator 1000 can apply AC power having a specific driving frequency to the plasma generator 2000. The RF generator 1000 can change the driving frequency of the AC power that is provided to the plasma generator 2000 by monitoring impedance of the plasma generator 2000 and power that is applied to the plasma generator 2000. Meanwhile, AC power may be construed as meaning an alternating current or an AC voltage in the specification.

The plasma generator 2000 can generate plasma. In detail, the plasma generator 2000 may include a means for generating plasma and a space in which plasma is formed. For example, the plasma generator 2000 may include an antenna structure as the device for generating plasma and may include a discharge tube as the space in which plasma is formed.

The plasma generator 2000 is electrically connected to the RF generator 1000 and can be provided with power from the RF generator 1000, and the RF generator 1000 can acquire information about a current or a voltage from the plasma generator 2000.

The plasma generator 2000 can generate plasma using power acquired from the RF generator 1000.

The processing chamber 200 can construct an environment in which plasma processing is performed. For example, the processing chamber 200 can provide a space for plasma processing, provide an object on which plasma processing is performed, and environmental variables (ex. internal pressure, temperature, etc.) to be suitable to plasma processing.

The RF generator 1000 and the plasma generator 2000 generate plasma for plasma processing and the processing chamber 200 provides an environment in which plasma processing is performed, whereby the plasma generation system 100 can perform plasma processing.

Hereafter, the RF generator 1000, the plasma generator 2000, and the processing chamber 200 are described in more detail.

(3) RF Generator

Figure 2:
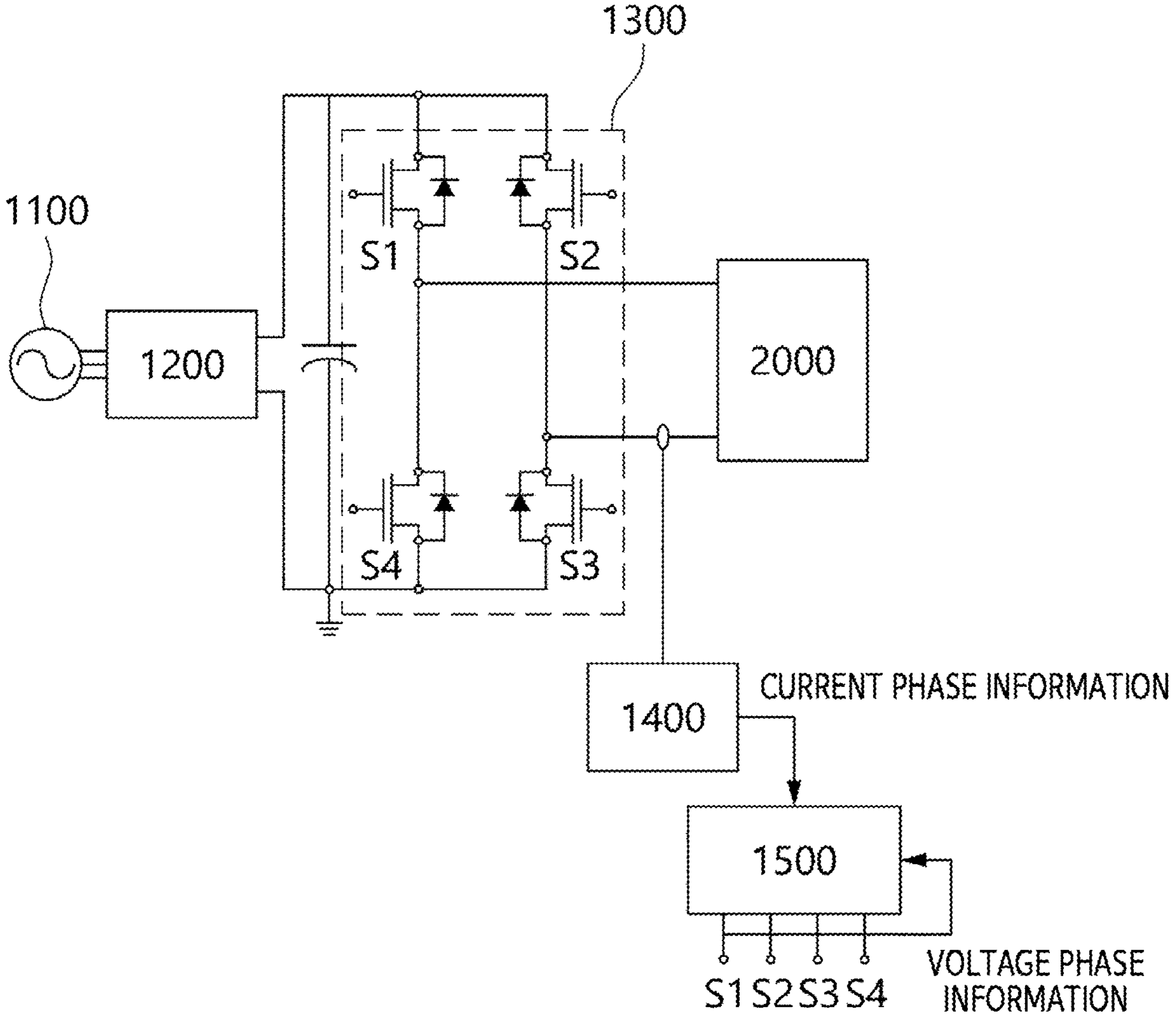
FIG. 2 is a view showing a radio frequency (RF) generator according to an embodiment of the present disclosure.

FIG. 2 is a view showing a radio frequency (RF) generator according to an embodiment of the present disclosure.

Referring to FIG. 2, the RF generator 1000 may include an AC power source 1100, a rectifier 1200, an inverter 1300, a sensor module 1400, and a controller 1500. The RF generator 10000 can convert first AC power, which is supplied from the AC power source 1100, into second AC power and supply the second AC power to a load. For example, the RF generator 1000 can convert first AC power, which is used at common home or industries, into second AC power having a frequency of hundreds of kHz to tens of MHz and a magnitude of several kW or more, and provide the second AC power to a load.

The load may include the plasma generator 2000 and plasma that is generated by the plasma generator 2000. The load may have a resonance frequency time-varying in accordance with plasma induction.

The rectifier 1200 can convert the output of the AC power source 1100 into DC. The rectifier 1200 can convert first AC power that is supplied from the AC power source 1100 into DC power and apply the DC power to both ends of the inverter 1300. Meanwhile, DC power may be construed as meaning a DC or a DC voltage in the specification.

The inverter 1300 can receive DC power from the rectifier 1200 and supply second AC power to the load. For example, the inverter 1300 can receive a switch signal from the controller 1500 and can provide second AC power to the load using the received switch signal.

The inverter 1300 may include at least one switch element that is controlled by a switch signal, and the second AC power that is supplied to the load from the inverter 1300 may have a driving frequency set based on a switch signal that the inverter 1300 is provided with from the controller 1500.

For example, the inverter 1300 may be implemented in a full bridge type. In detail, the inverter 1300 may include first to fourth switches S1, S2, S3, and S4. The first to fourth switches S1, S2, S3, and S4 can be turned on or turned off by receiving a switch signal from the controller 1500. When the first and third switches S1 and S3 are turned on and the second and fourth switches S2 and S4 are turned off, a positive voltage can be applied to the load, and when the first and third switches S1 and S3 are turned off and the second and fourth switches S2 and S4 are turned on, a negative voltage can be applied to the load. As described above, the inverter 1300 alternately applies a positive voltage and a negative voltage to the load, thereby being able to apply AC power having a specific frequency.

In other example, the inverter 1300 may be implemented in a half bridge type. In a detail, the inverter 1300 may include a first and a second switch. Here, the first switch and the second switch can be turned on or turned off by receiving a switch signal from the controller 1500. When the first switch turns on and the second switch turns off, a positive voltage is applied the load, and when the first switch turns off and the second switch turns on, a negative voltage is applied to the load.

As described above, the inverter 1300 alternately applies a positive voltage and a negative voltage to the load, thereby being able to apply AC power having a specific frequency.

The method of implementing the inverter 1300 is not limited to that described above, and may mean a configuration including a circuit structure that performs a function of converting DC power into AC power.

The inverter 1300 may be controlled, for example, in a time delay type, a Pulse Width Modulation (PWM) type, or a combination thereof, depending on frequency control methods.

Meanwhile, a capacitive element may be disposed between the rectifier 1200 and the inverter 1300. For example, the RF generator 1000 includes a capacitor connected in parallel to the rectifier 1200 and the inverter 1300, and the capacitor can discharge the AC component of power applied to the inverter 1300 to a ground node GND.

The controller 1500 can generate a switch signal by receiving data sensed by the sensor module 1400 to be described below. For example, the controller 1400 may be implemented to generate a switch signal by acquiring data related to a resonance frequency such as the current and the voltage of the load from the sensor module 1400. In detail, the controller 1500 can acquire phase difference data or a delay time using phase data of a current applied to the load and phase data of a voltage applied to the load, which are acquired from the sensor module 1400, and can generate a switch signal on the basis of the phase delay data or the delay time.

The controller 1500 may be implemented using a Field Programmable Gate Arrays (FPGA) technology. The detailed configuration and structure of the controller 1500 will be described below.

The sensor module 1400 can acquire data related to the resonance frequency of the load, or data related to power that is supplied to the load, from the controller 1500.

Though not shown in FIG. 2, the sensor module 1400 may include a current transformer, a filter, and a comparer. The sensor module 1400 can receive a current or voltage signal flowing to the load through the current transformer, convert the current or voltage signal into a current or voltage signal having a different magnitude, filter the converted current or voltage using the filter, and output phase data to the controller 1500 through the comparer.

The current transformer may be inductively coupled to a wire between the inverter 1300 and the load, and can convert and provide the voltage or current signal, which is applied to the load, to the filter. In detail, the current transformer can convert a current flowing through a conductive wire connected to the load into a voltage signal.

The filter can remove an AC component from the input current or voltage signal and then output the current or voltage signal to the comparer. To this end, the filter can perform high-band pass filtering or low-band pass filtering.

The comparer can acquire phase data. For example, the comparer can acquire phase data by comparing a voltage signal acquired from the current transformer or the filter with a preset value. The phase data may mean phase data of the current that is applied to the load.

Of course, at least one of the components included in the sensor module 1400 may be omitted and may be implemented in another way.

Meanwhile, though not shown in FIG. 2, the RF generator 1000 may include a memory. The memory can store various data. Various data may be temporarily or semi-permanently stored in the memory. The memory, for example, may be a Hard Disk Drive (HDD), a Solid State Drive (SSD), a flash memory, a Read-Only Memory (ROM), a Random Access Memory, etc. The memory may be implemented in a type that is disposed in or detachably attached to the RF generator 1000.

As described above, the RF generator 1000 can control the driving frequency of second AC power that is provided to the load on the basis of data related to the resonance frequency of the load. In other words, the RF generator 1000 can output the driving frequency of the second AC power to correspond to the resonance frequency of the load by tracing the resonance frequency of the load that changes with plasma generation. Accordingly, it is possible to prevent unnecessary power consumption and improve the durability of the plasma system.

At least one of the components of the RF generator 1000 described above may be omitted. For example, the RF generator 1000 may acquire electrical data about the load from an external sensor without including the sensor module 1400. As another example, the RF generator 1000 may be provided with DC power or rectified DC power from the outside without including the AC power source 1100 and the rectifier 1200.

An RF generator 1000 that is used for a single station was mainly described above, and when the RF generator 1000 is used for a multi-station, the function or the structure of the configuration may be at least partially changed. An RF generator 1000 that is used for a multi-station will be described in detail below.

(4) Plasma Generator

Figure 3:
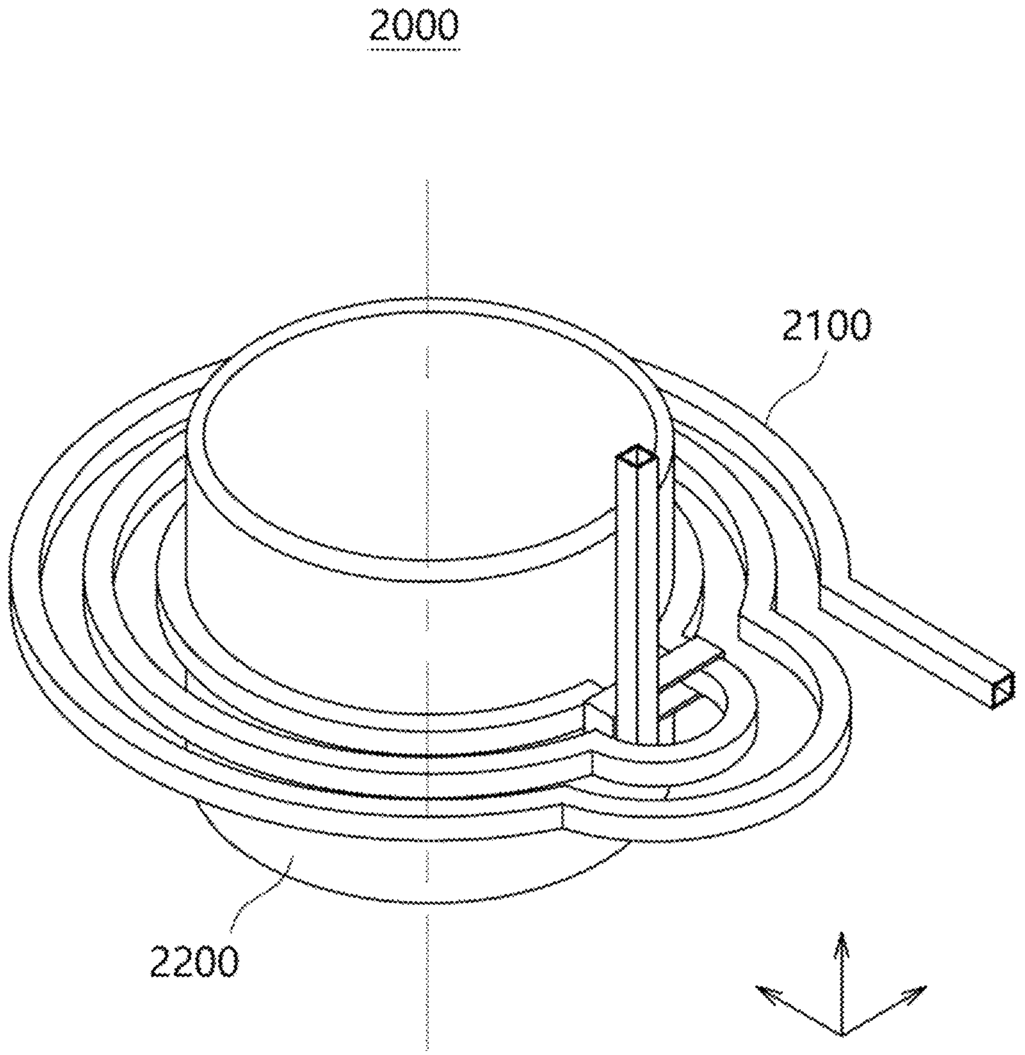
FIG. 3 is a view showing a plasma generator according to an embodiment of the present disclosure.

FIG. 3 is a view showing the plasma generator 2000 according to an embodiment of the present disclosure.

Referring to FIG. 3, the plasma generator 2000 may include an antenna structure 2100 and a discharge tube 2200.

The antenna structure 2100 is disposed around the discharge tube 2200 and can induce plasma generation by forming an electromagnetic field in the discharge tube 2200. For example, the antenna structure 2100 is supplied with power from the RF generator 1000 and forms an electromagnetic field in the discharge tube 2200, thereby being able to induce plasma generation.

The antenna structure 2100 may include at least one antenna unit. For example, the antenna structure 2100 may be composed of one antenna unit having a ring shape and disposed to surround the discharge tube 2200. As another example, the antenna structure 2100 may include two or more antenna units having different radii of curvature, and the antenna units may be disposed in the same plane to surround the discharge tube 2200. As another example, the antenna structure 2100 may include two or more antenna units and the two or more antenna units may be disposed to surround the discharge tube 2200 in different planes.

The antenna structure 2100 may be electrically connected to the RF generator 1000. For example, a first end of the RF generator 1000 is electrically connected to a first end of the antenna structure 2100 and a second end of the RF generator 1000 is electrically connected to a second end of the antenna structure 2100, whereby the RF generator 1000 can supply power to the antenna structure 2100. As another example, the RF generator 1000 may be connected to the antenna structure 2100 through a specific electric element. In detail, the first end and the second end of the antenna structure 2100 each may be connected to a capacitor, and the capacitors may be connected to the first end and the second end of the RF generator 1000, respectively.

The discharge tube 2200 can provide a space in which plasma generation is induced.

The discharge tube 2200 may be fluidically connected to the processing chamber 200 to be described below. For example, a flow path through which fluid can move may be formed between the discharge tube 2200 and the processing chamber 200. In more detail, the discharge tube 2200 and the processing chamber 200 may be connected through a conduit.

The discharge tube 2200 may be made of various materials. For example, the discharge tube 2200 may be made of a non-conductive material or a material having thermal conductivity. In detail, the discharge tube 2200 may be made of an aluminum nitride (AlN), an aluminum hydroxide ($Al_2O_3$), a silicon nitride (SiN), a silicon nitride ($Si_3N_4$), a silicon dioxide ($SiO_2$), an Yttrium oxide ($Y_2O_3$), or a silicon carbide (SiC).

Further, the discharge tube 2200 may be made of a material that does not produce particles when reacting with gas (ex. $NF_3$, Ar, $CO_2$, $CH_4$, $NF_3$, $O_2$, $H_2$, etc.) that flows into the discharge tube 2200 to induce plasma.

The plasma generator 2000 may further include DC electrode. The DC electrode may receive electric power and generate DC discharge in the discharge tube 2200.

The plasma generator 2000 may further include an ignition coil. The ignition coil may have a form similar with the antenna structure 2100 described before. The ignition coil may receive electric power and form electromagnetic force inside the discharge tube 2200. The ignition coil may ignite plasma inside the discharge tube 2200 with the DC electrode.

2. Type of Plasma Processing

Hereafter, a type in which plasma processing is performed is described with reference to FIGS. 4A, 4B, and 5.

(1) Single Station

Figures 4A, 4B:
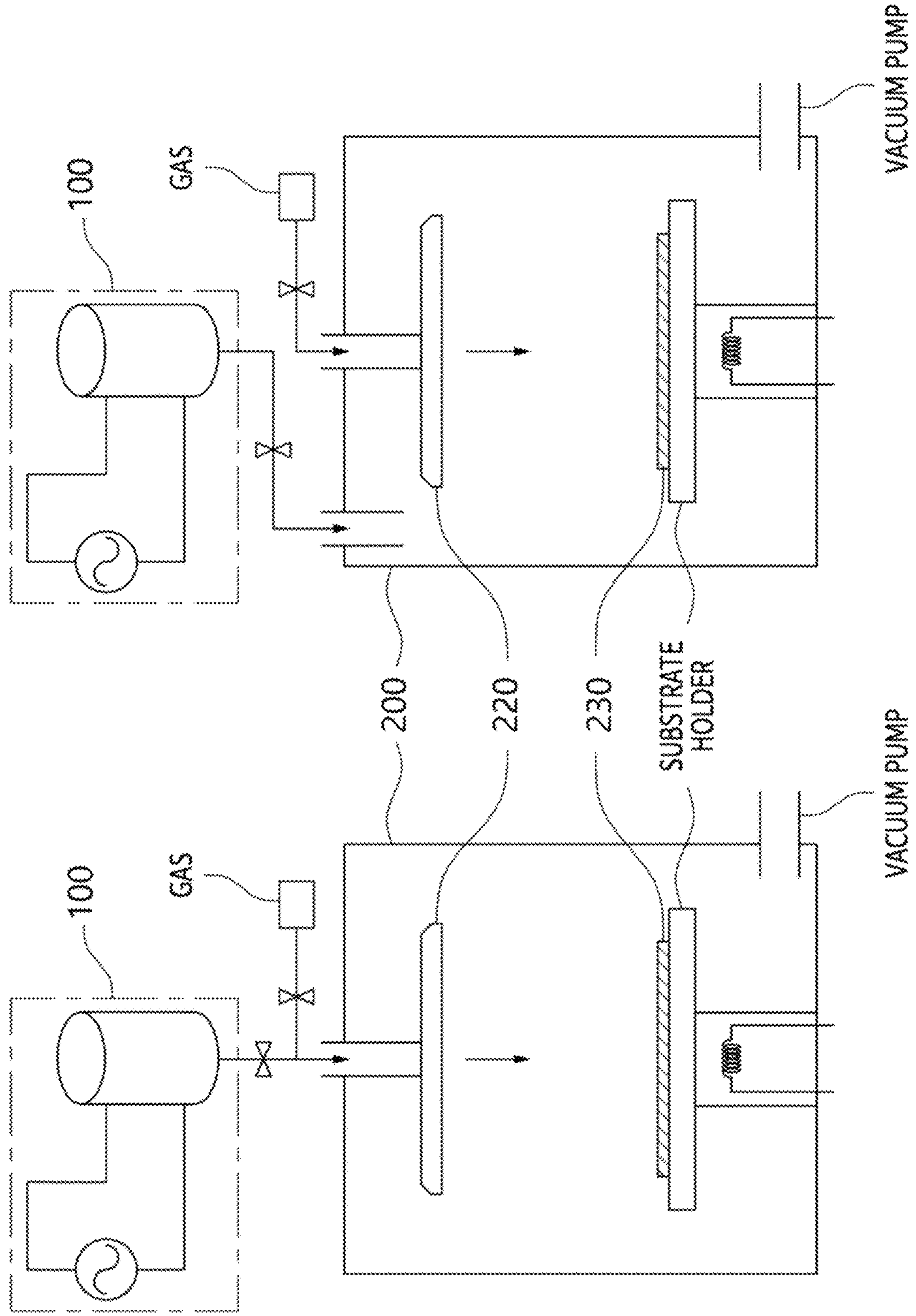
FIGS. 4A and 4B are views showing procedure of plasma processing at a single station according to an embodiment of the present disclosure.

FIGS. 4A and 4B are views showing procedures of plasma processing at a single station according to an embodiment of the present disclosure.

Plasma processing may be performed using the plasma generation system 100 and the processing chamber 200 providing a single station. Referring to FIGS. 4A and 4B, the processing chamber 200 includes a head 220, a substrate 230, a substrate holder, a vacuum pump, and may include an internal space in which these components are disposed.

The head 220 can provide a flow path for supplying fluid required for a process into the processing chamber 200. For example, a process gas such as ion gas or radical produced in the plasma generation system 100, gas provided from a specific gas supplier, etc. flow into the processing chamber 200 through the head 220 of the processing chamber 200, and processes such as etching, deposition, washing, etc. can be performed on the substrate 230 by the inflow gas.

The substrate 230 may mean an object on which plasma processing is performed. For example, the substrate 230 may mean a wafer that is used in a semiconductor process, a glass substrate that is used in a display process, a mask for patterning, etc.

The substrate holder can support the substrate 230 in the processing chamber 200. The substrate holder may include a heating member. The substrate holder is electrically connected to a specific power device, thereby being able to be supplied with power.

The vacuum pump can control the internal pressure of the processing chamber 200. For example, the vacuum pump can control the internal pressure of the processing chamber 200 to correspond to plasma processing to be performed, for example, making the inside of the processing chamber 200 into a vacuum state or an atmospheric state.

The plasma generation system 100 may be fluidically connected to the processing chamber 200 in various ways.

For example, referring to FIG. 4A, the plasma generation system 100 may be fluidically connected to the head 220 of the processing chamber 200. A process gas produced in the plasma generation system 100 can flow into the processing chamber 200 through the head of the processing chamber 200. This structure may be used to perform processes, such as deposition, etching, washing, etc., on the substrate 230.

As another example, referring to FIG. 4B, the plasma generation system 100 may be fluidically connected to the inside of the processing chamber 200 not through the head 220 of the processing chamber 200. In this case, the process gas that is provided from a gas supplier may flow inside through the head 220 of the processing chamber 200 and the process gas produced in the plasma generation system 100 may flow into the processing chamber 200 through another flow path rather than the head 220. This structure may be used to perform a process of washing the inside of the processing chamber 200.

Meanwhile, the connection structure of the plasma generation system 100 and the processing chamber 200 or the plasma processing that corresponds to the connection structure is not limited to that described above.

(2) Multi-station

The configuration and structure when the plasma processing system 10 is used at a single station were described above. Meanwhile, the plasma processing system 10 can perform plasma processing even for a plurality of stations, and in this case, a plurality of plasma processing may be performed in parallel, different plasma processing may be performed in parallel, or time-series plasma processing may be continuously performed, that is, the process efficiency can be greatly improved in comparison to the case using a single station. In particular, as will be described below, when a multi-station is used and a system of plasma processing that corresponds to each of the stations is provided, the process efficiency can be maximized and the available range of the process can be increased.

Figure 5:
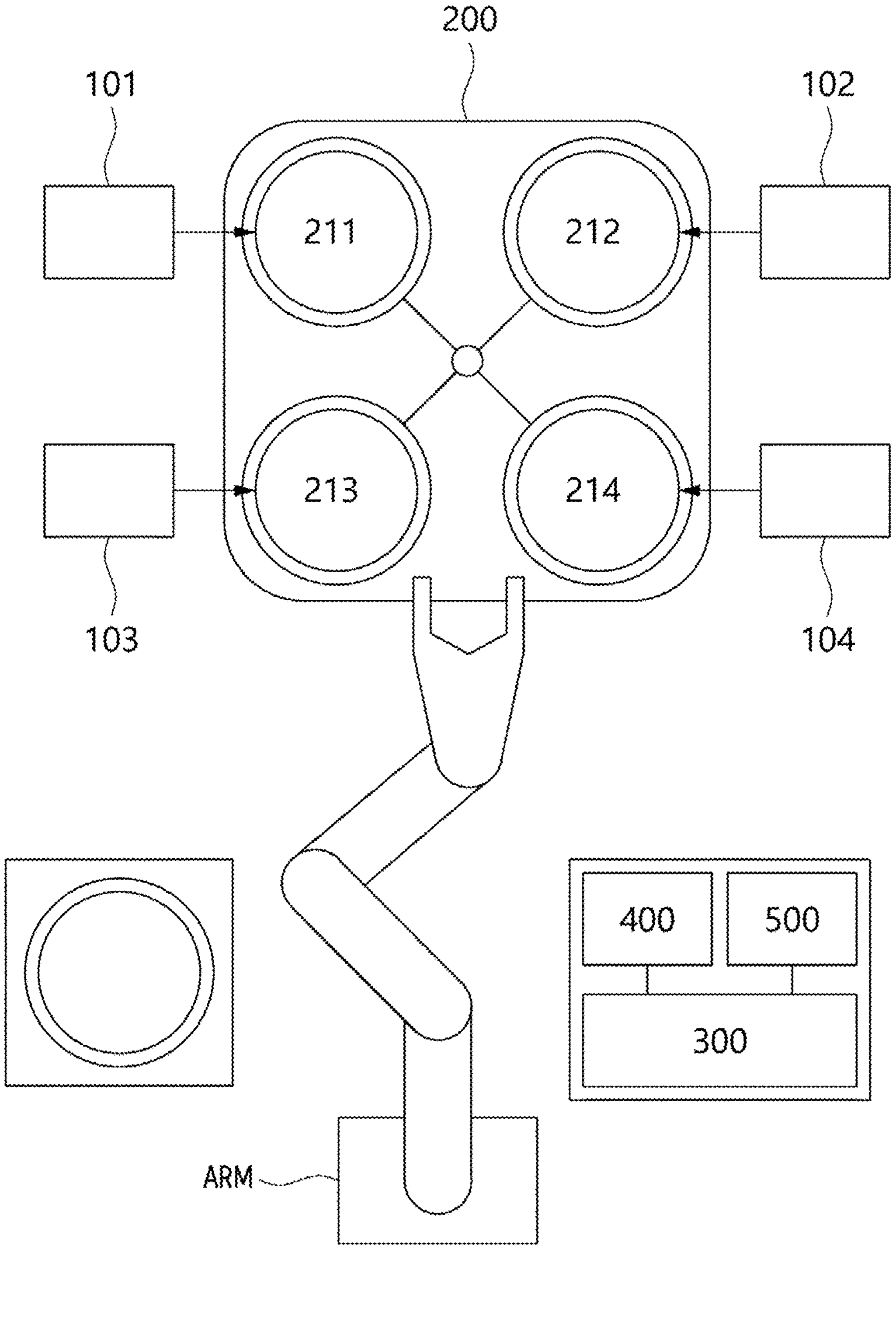
FIG. 5 is a view showing a multi-station for plasma processing according to an embodiment of the present disclosure.

FIG. 5 is a view showing a multi-station for plasma processing according to an embodiment of the present disclosure.

Referring to FIG. 5, the plasma processing system 10 may include two or more plasma generation systems 100, a processing chamber 200 including two or more stations, a power distributor 300, a sensing unit 400, and a central controller 500.

The plasma processing system 10 may include a plurality of stations. For example, the plasma processing system 10 may include first to fourth stations 211, 212, 213, and 214. Hereafter, the case in which the plasma processing system 10 includes four stations is described for the convenience of description, but the technical ideas of the present disclosure are not limited thereto and the number of the stations included in the plasma processing system 10 may be variously changed, if necessary.

The plasma processing system 10 may include a plurality of plasma generation systems 100. The plasma generation systems 100 may correspond to the stations included in the plasma processing system 10, respectively. For example, as shown in FIG. 5, the plasma processing system 10 may include first to fourth plasma generation systems 101, 102, 103, and 104, and the first to fourth plasma generation systems 101, 102, 103, and 104 may be fluidically connected to first to fourth stations 211, 212, 213, and 214, respectively. The plasma generation systems 100 can provide a process gas required for plasma processing to the stations, respectively.

Meanwhile, in the plasma processing system 10 for a multi-station, the number of plasma generation systems 100 and the number of stations may not be the same. For example, the plasma processing system 10 may include first and second plasma generation systems 101 and 102, and may include first and second stations 211 and 212 fluidically connected to the first plasma generation system 101 and third and fourth stations 213 and 214 fluidically connected to the second plasma generation system 102. Hereafter, the case in which the plasma processing system 10 includes first to fourth plasma generation systems 101, 102, 103, and 104 corresponding to first to fourth stations 211, 212, 213, and 214, respectively, is described for the convenience of description, but the technical ideas of the present disclosure are not limited thereto.

The power distributor 300 can distribute power to the plasma generation systems 100. For example, the power distributor 300 can monitor the situations of the first to fourth plasma generation systems 101, 102, 103, and 104 and can provide necessary power. In detail, the power distributor 300 can receive in real time power sensing data of each of the first to fourth plasma generation systems 101, 102, 103, and 104 from the sensing unit 400, and can provide power required for each of the first to fourth plasma generation systems 101, 102, 103, and 104 on the basis of the power sensing data. The power distributor 300 may include a power supplier or may be supplied with power from the outside. The power that is applied to the power distributor 300 may be DC power acquired by rectifying AC power, which would be understood as the same as providing DC power using the AC power source 1100 and the rectifier 1200 described with reference to FIG. 2.

The sensing unit 400 can sense the electric characteristics of the components in the plasma processing system 10. The electric characteristic may mean data about a current, the phase of a current, a voltage, the current of a voltage, a phase difference of a current and a voltage, power, or the like. For example, the sensing unit 400 can measure the phase of a current flowing through the plasma generator 2000 of the plasma generation system 100. As another example, the sensing unit 400 can measure (the amount of) power that is supplied from or consumed by the plasma generation system 100. As another example, the sensing unit 400 can measure power that is supplied from or consumed by the plasma processing system 10. Of course, the sensing unit 400 can measure an electric characteristic at any one specific element or specific position and can measure an electric characteristic at a plurality of specific elements or specific positions. The sensing unit 400 can measure an electric characteristic in real time while the plasma processing system 10 operates. The sensing unit 400, as described above, can acquire sensing data by measuring an electric characteristic in the plasma generation system 100.

The sensing unit 400 can provide the acquired sensing data to the power distributor 300. The sensing unit 400 can provide the acquired sensing data to the central controller 500.

The central controller 500 can control the frequency of the power that is applied to the plasma generator 2000 from the plasma generation system 100. For example, the central controller 500 is electrically connected to a first RF generator of the first plasma generation system 101 and can control the first RF generator to change the driving frequency of AC power that is applied to a first plasma generator of the first plasma generation system 101. The process in which the central controller 500 controls the driving frequency in each plasma generation system 100 is described in detail below.

The plasma processing system 10 of a multi-station may further include components for managing plasma processing, as follows, beside the components described above.

The plasma processing system 10 may include a system controller configured to control the power distributor 300, the sensing unit 400, the central controller 500, etc. described above, a memory unit configured to store commands that are executed in the system controller and data measured by the sensing unit 400, an input unit receiving input for controlling plasma processing from the outside, an output unit outputting information about the plasma processing system 10, a communication unit configured to communicate with the outside, etc.

The plasma processing system 10 may include a robot arm configured to move a process object such as the substrate 230 to each station. The robot arm can be controlled by the system controller. For example, the system controller can acquire proceeding data related to the degree of proceeding of plasma processing at each station and can control the robot arm on the basis of the acquired proceeding data.

The plasma processing system 10 may include a gas supplier configured to supply a process gas that is used in plasma processing. The gas supplier may include a first gas supplier fluidically connected to at least some of the stations of the plasma processing system 10 to provide gas required for a process and/or a second gas supplier fluidically connected to the plasma generator 2000 to provide gas required to form plasma.

The first gas supplier can provide gas to each of the stations of the processing chamber 200. For example, the first gas supplier can provide the same gas to the first to fourth stations 211, 212, 213, and 214. As another example, the gas supplier may include a plurality of gas reservoirs and the gas reservoirs may be fluidically connected to different stations, respectively. The gas reservoirs can provide the same process gas or different process gases, depending on the plasma processing that proceeds at the stations fluidically connected thereto, respectively.

The second gas supplier can provide gas to the plasma generator 2000. For example, the second gas supplier can provide the same gas or different gases to the first to fourth plasma generators, depending on the proceeding plasma processing.

3. Connection Relationship Between Components of System of Plasma Processing

(1) First Embodiment

Hereafter, the connection relationship between components of the plasma processing system 10 for a multi-station is described.

Figure 6:
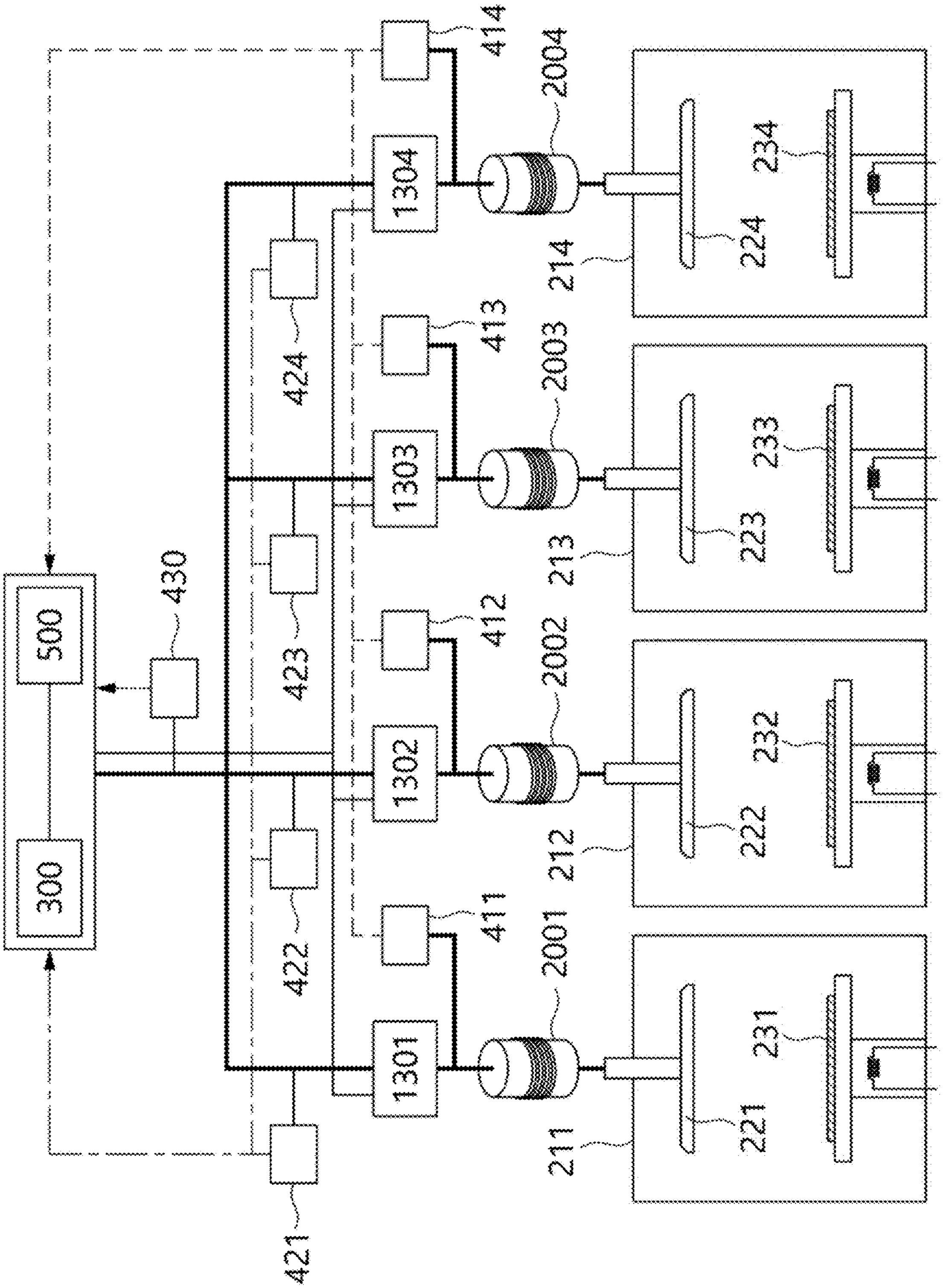
FIG. 6 is a view showing the relationship of components in a system of plasma processing for a multi-station according to an embodiment of the present disclosure.

FIG. 6 is a view showing the connection relationship of components in the plasma processing system 10 for a multi-station according to an embodiment of the present disclosure.

Hereafter, for the convenience of description, the case in which the plasma processing system 10 includes four stations, as described above with reference to FIG. 5, is described, and the description of one station can be construed as being able to be applied to also another station unless specifically described.

The plasma processing system 10 may include first to fourth plasma generation system 101, 102, 103, and 104 and a processing chamber 200, and the processing chamber 200 may include first to fourth stations 211, 212, 213, and 214. The stations each may include a head, a substrate, and a substrate holder on which the substrate is placed. For example, the first station 211 may include a first head 221 and a first substrate holder on which the first substrate 231 is placed.

The stations in the processing chamber 200 may be fluidically connected to corresponding plasma generators 2000, respectively. For example, the first head 221 of the first station 211 may be fluidically coupled to the first plasma generator 2001 and can be provided with a process gas from the first plasma generator 2001. The first plasma generator 2001 may be connected to the internal space of the first station 211 through a specific flow path rather than the first head 221.

The plasma generators 2000 fluidically coupled to the stations, respectively, may be electrically connected to corresponding inverters 1300, respectively. For example, the first plasma generator 2001 fluidically coupled to the first station 211 may be electrically connected to the first inverter 1301.

The inverter 1300 can provide AC power to the plasma generator 2000. For example, the first plasma generator 2001 can be provided with first AC power having a first driving frequency from the first inverter 1301 and can induce plasma generation. The first inverter 1301 can receive a first switch signal from the central controller 500 and can provide first AC power having a first driving frequency corresponding to the first switch signal to the first plasma generator 2001. Meanwhile, the driving frequency of the first AC power that is provided by the first inverter 1301 and the second driving frequency of the second AC power that is provided by the second inverter 1302 may be the same or different from each other, depending on plasma processing that is performed.

The driving frequency of the AC power that is provided by the inverter 1300 may be changed in real time. For example, the central controller 500 can change the first switch signal that is provided to the first inverter 1301 on the basis of current and/or voltage phase data or phase data acquired from a first phase measuring unit 411 to be described below, and accordingly, the first driving frequency of the first AC power that is applied to the first plasma generator 2001 from the first inverter 1301 can be changed.

The inverter 1300 that supplies power to the plasma generators 200 may be electrically connected to the power distributor 300. For example, the first to fourth inverters 1301, 1302, 1303, and 1304 may be electrically connected to the power distributor 300. The power distributor 300 can provide DC power to the first to fourth inverters 1301, 1302, 1303, and 1304. For example, the power distributor 300 can apply first DC power to the first inverter 1301.

The power distributor 300 may provide different power, depending on the stations. For example, the power distributor 300 may provide first DC power to the first inverter 1301 and may provide second DC power that is different from the first DC power to the second inverter 1302. In this case, the DC power that is provided to each of the inverters 1300 from the power distributor 300 may be set on the basis of plasma processing that is performed at each of the stations and/or power that is consumed at each of the stations.

The magnitude of the DC power that is provided to each of the inverters 1300 from the power distributor 300 may be changed in real time. For example, the power distributor 300 can acquire data related to power that is consumed by the first inverter 1301 and the first plasma generator 2001 from a first partial power measuring unit 421 in accordance with plasma processing at the first station 211, and can change the magnitude of the DC power that is applied to the first inverter 1301 on the basis of the acquired partial power consumption data.

The plasma processing system 10 may include a sensing unit 400. The sensing unit 400 may include a phase measuring unit, a partial power measuring unit, and an entire power measuring unit 430.

The phase measuring unit can measure the phase of a current or a voltage that is applied to the plasma generator 2000. For example, the first phase measuring unit 411 can measure the phase of a current or a voltage that the first inverter 1301 applies to the first plasma generator 2100. To this end, the first phase measuring unit 411 may be electrically connected to the first inverter 1301 and the first plasma generator 2001. In detail, the first phase measuring unit 411 may be electrically coupled to a conductive wire connecting the first inverter 1301 and the first plasma generator 2001.

As another embodiment, the phase measuring unit can measure the phase difference of a current and a voltage that are applied to the plasma generator 2000. In detail, the first phase measuring unit 411 measures the phase of a current that is applied to the first plasma generator 2001 from the first inverter 1301 and acquires a switch signal that is provided to the first inverter 1301, thereby being able to acquire the phase of a voltage that is applied to the first plasma generator 2001 and acquire phase difference data by comparing the phase of the current and the phase of the voltage.

The phase measuring unit can provide measurement data to a central controller 500 to be described below. For example, the first phase measuring unit 411 can transmit data related to the phase of a current, which the first inverter 1301 applies to the first plasma generator 2100, to the central controller 500. As another example, the first phase measuring unit 411 can transmit data related to the phase difference of a voltage and a current, which are applied to the first plasma generator 2100, to the central controller 500. To this end, the phase measuring unit can perform wired or wireless data communication with the central controller 500.

Meanwhile, the phase measuring unit, if necessary, may provide the data described above to the power distributor 300.

The partial power measuring unit can measure power that is consumed by the inverter 1300 and the plasma generator 2000 as plasma processing is performed at the stations. For example, a first partial power measuring unit 421 can measure power that is consumed by the first plasma system 101 as plasma processing is performed at the first station 211 by measuring a current and a voltage that the power distributor 300 applies to the first inverter 1301. To this end, the first partial power measuring unit 421 may be electrically connected to the first inverter 1301 and the power distributor 300. In detail, the first partial power measuring unit 421 may be electrically connected to a power line for the power distributor 300 to transmit power to the first inverter 1301.

Meanwhile, the partial power measuring unit may be divided into a partial current measuring unit and a partial voltage measuring unit. The partial current measuring unit can measure the current that is applied to each of the inverters 1300 and the partial voltage measuring unit can measure the voltage that is applied to each of the inverters 1300. The partial current measuring unit needs first to fourth partial current measuring units corresponding to the first to fourth inverters 1301, 1302, 1303, and 1304, respectively, but the partial voltage measuring unit may measure the voltage of only one of the first to fourth inverters 1301, 1302, 1303, and 1304. The partial power measuring unit can calculate power consumption corresponding to each of the stations on the basis of current and voltage data measured by the partial current measuring unit and the partial voltage measuring unit.

The partial power measuring unit can provide the acquired power consumption data of each of the stations to the central controller 500 and/or the power distributor 300.

The entire power measuring unit 430 can measure the total power that is consumed by plasma processing that is performed in the plasma processing system 10. In other words, the entire power measuring unit 430 can measure the total power that is consumed as plasma processing is performed at the first to fourth stations 211, 212, 213, and 214. The entire power measuring unit 430 is electrically connected to the power distributor 300 and can measure power that is provided to the first to fourth inverters 1301, 1302, 1303, and 1304 from the power distributor 300. The entire power measuring unit 430 can provide the data related to the acquired total power consumption to the central controller 500 and/or the power distributor 300.

Meanwhile, the entire power measuring unit 430 may be omitted. For example, the central controller 500 can calculate total power that is consumed as plasma processing is performed at all of the stations in the processing chamber 200 on the basis of the power data acquired from the partial power measuring unit.

Although not shown in FIG. 6, the plasma processing system 10 may further include a system controller and a gas supplier.

The system controller can control the central controller 500 and the gas supplier. For example, the system controller can control the points in time at which the central controller 500 is operated to start and finish plasma processing, and the point in time at which a valve of the gas supplier is opened. Since the gas supplier was described with reference to FIG. 5, it is not described here.

(2) Second Embodiment

Figure 7:
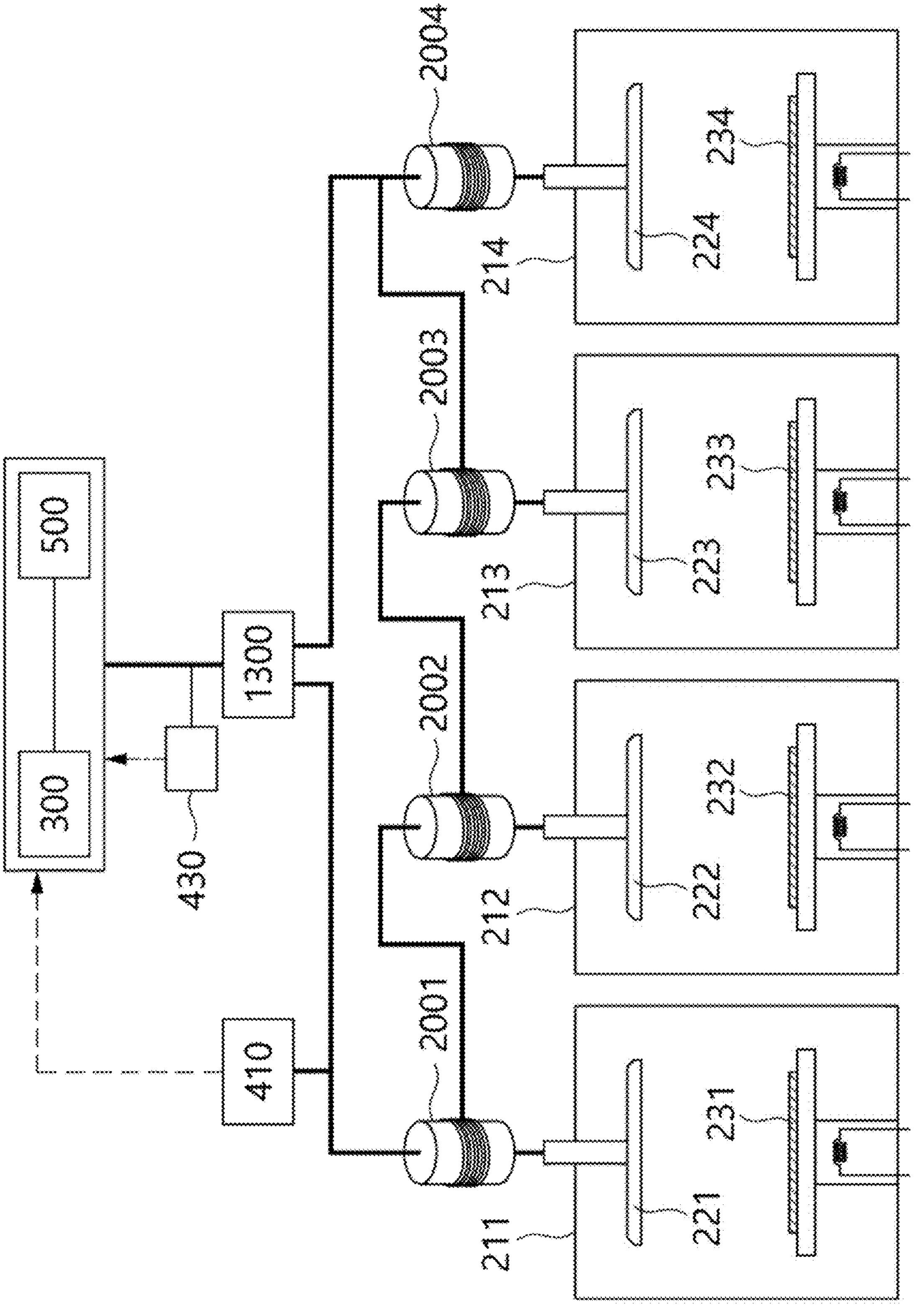
FIG. 7 is a view showing the relationship of components in a system of plasma processing for a multi-station according to another embodiment of the present disclosure.

FIG. 7 is a view showing the relationship of components in a plasma processing system 10 for a multi-station according to another embodiment of the present disclosure. Hereafter, in relation to description of the plasma processing system 10, those described above with reference to FIG. 6 are omitted.

Referring to FIG. 7, a plasma processing system 10 includes a plurality of plasma generators 2000 and may include an inverter 1300 configured to apply AC power having a specific driving frequency to each of the plasma generators 2000.

The inverter 1300 can provide AC power simultaneously to first to fourth plasma generators 2001, 2002, 2003, and 2004. The AC power that the inverter 1300 provides to the first to fourth plasma generators 2001, 2002, 2003, and 2004 may have the same magnitude and different driving frequencies. For example, the inverter 1300 may provide first AC power having a first driving frequency to the first plasma generator 2001 and second DC power having a second driving frequency different from the first driving frequency to the second plasma generator 2002, in which the magnitudes of the first AC power and the second AC power may be the same.

The plasma processing system 10 shown in FIG. 7 has a simple structure in comparison to the plasma processing system 10 described with reference to FIG. 6, so the physical volume of the plasma processing system 10 may be decreased.

(3) Third Embodiment

Figure 8:
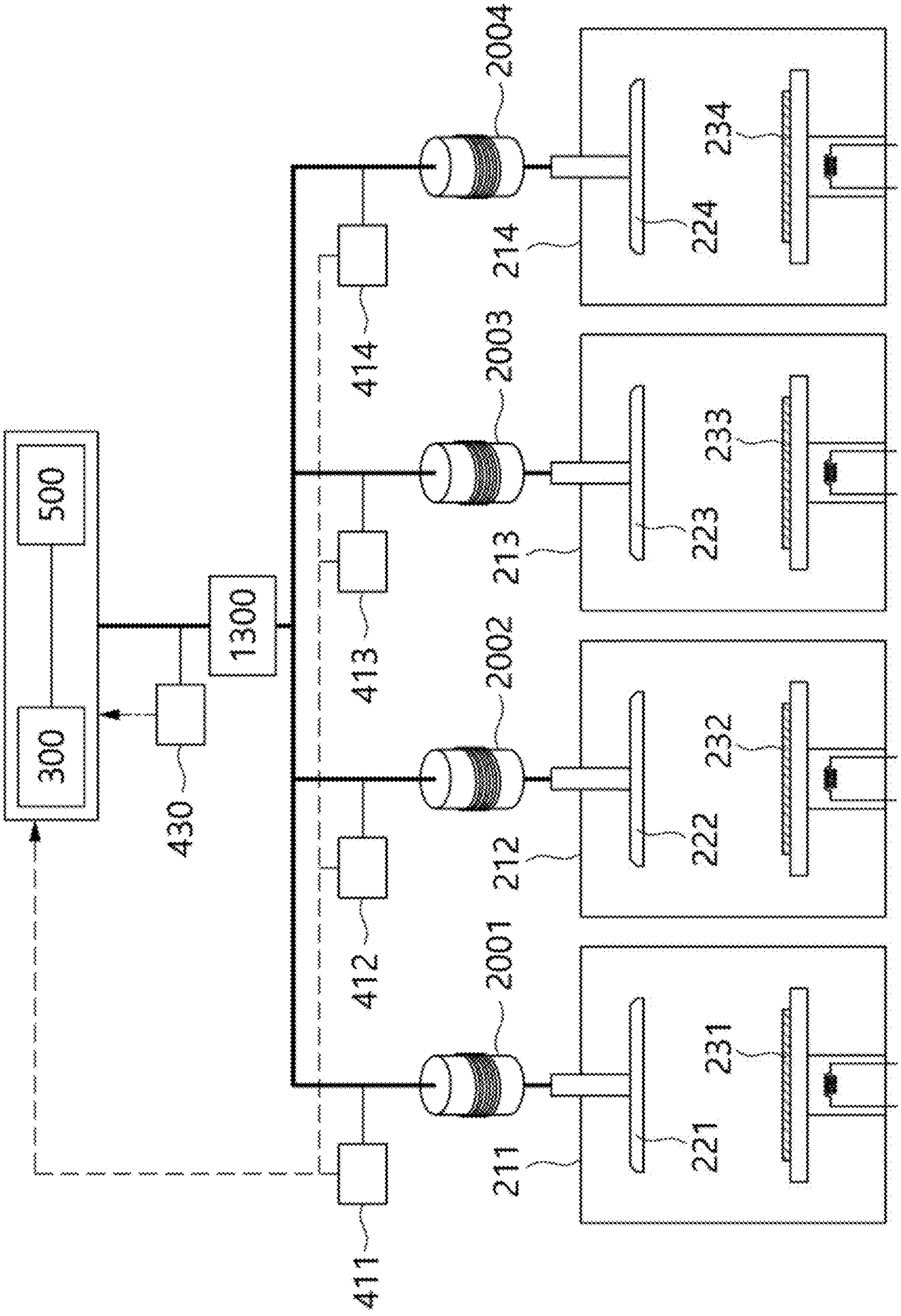
FIG. 8 is a view showing the relationship of components in a system of plasma processing for a multi-station according to another embodiment of the present disclosure.

FIG. 8 is a view showing the relationship of components in a plasma processing system 10 for a multi-station according to another embodiment of the present disclosure. Hereafter, in relation to description of the plasma processing system 10, those described above with reference to FIG. 6 are omitted.

Referring to FIG. 8, the plasma processing system 10 may include a plurality of plasma generators 2000 electrically connected to each other in series. For example, the plasma processing system 10 may include an inverter 1300 and first to fourth plasma generators 2001, 2002, 2003, and 2004 electrically connected to the inverter 1300, and the first to fourth plasma generators 2001, 2002, 2003, and 2004 may be electrically connected to each other in series. In detail, the inverter 1300 may provide power through a first end and a second end thereof, a first end of a first antenna structure of the first plasma generator 2001 may be electrically connected to the first end of the inverter 1300, a second end of the first antenna structure may be electrically connected to a first end of a second antenna structure of the second plasma generator 2002, a second end of the second antenna structure may be electrically connected to a first end of a third antenna structure of the third plasma generator 2003, a second end of the third antenna structure may be electrically connected to a first end of a fourth antenna structure of the fourth plasma generator 2004, and a second end of the fourth antenna structure may be electrically connected to the second end of the inverter 1300.

The first to fourth plasma generators 2001, 2002, 2003, and 2004 that are connected in series may be connected through an electrical element such as a capacitor, an inductor, and/or a resistor.

The plasma processing system 10 may include one inverter 1300. The inverter 1300 can provide the same power to the first to fourth plasma generators 2001, 2002, 2003, and 2004. For example, the magnitudes and phases of the AC power that is provided to the first to fourth plasma generators 2001, 2002, 2003, and 2004 by the first inverter 1300 may be the same, respectively. Accordingly, the difference of induced electromotive forces for inducing plasma in the first to fourth plasma generators 2001, 2002, 2003, and 2004 can be minimized. The power consumption of the first to fourth plasma generators 2001, 2002, 2003, and 2004 may be different.

The plasma processing system 10 may include one phase measuring unit 410. The phase measuring unit 410 can measure the phase of a voltage or a current that is provided from the inverter 1300. The phase measuring unit 410 can provide information about the measured phase to the power distributor 300 or the central controller 500.

The power distributor 300 or the central controller 500 can control the inverter 1300 on the basis of the phase information acquired from the phase measuring unit 410. For example, the power distributor 300 or the central controller 500 can acquire phase difference information of a voltage and a current that are applied to the first to fourth plasma generators 2001, 2002, 2003, and 2004 on the basis of the phase information of a current acquired from the phase measuring unit 410 and a switch signal provided to the inverter 1300, and can provide a switch signal to the inverter 1300 such that the phase difference of the voltage and the current decreases. Not one, but a plurality of phase measuring units 410 may be provided for the plasma generators 2000, respectively.

In the configuration in which a plurality of plasma generators 2000 is connected in series in the plasma processing system 10, an antenna structure 2100 of each of the plasma generator 2000 may include a plurality of inductive elements and capacitive elements.

For example, the antenna structure 2100 may include a first turn antenna disposed to surround the discharge tube 2200 and having a first radius of curvature, a second turn antenna disposed to surround the first turn antenna and having a second radius of curvature larger than the first radius of curvature, and an inter-turn capacitor electrically connecting the first turn antenna and the second turn antenna.

In the plasma processing system 10, the first turn antenna of the first plasma generator 2001 may be electrically connected to the first end of the inverter 1300, the second turn antenna of the first plasma generator 2001 may be electrically connected to the first turn antenna of the second plasma generator 2002, the second turn antenna of the second plasma generator 2002 may be electrically connected to the first turn antenna of the third plasma generator 2003, the second turn antenna of the third plasma generator 2003 may be electrically connected to the first turn antenna of the fourth plasma generator 2004, and the second turn antenna of the fourth plasma generator 2004 may be electrically connected to the second end of the inverter 1300. The first end of the inverter 1300 and the first turn antenna of the first plasma generator 2001 may be electrically connected through a capacitive element. Similarly, the second turn antenna of the first plasma generator 2001 and the first turn antenna of the second plasma generator 2002, the second turn antenna of the second plasma generator 2002 and the first turn antenna of the third plasma generator 2003, the second turn antenna of the third plasma generator 2003 and the first turn antenna of the fourth plasma generator 2004, and the second turn antenna of the fourth plasma generator 2004 and the second end of the inverter 1300 may be electrically connected through a capacitive element.

As another embodiment, the antenna structure 2100 may include a first layer antenna disposed to surround the discharge tube 2200 and having a first radius of curvature, a second layer antenna disposed to surround the discharge tube 2200 at a predetermined distance from the first layer antenna in a direction parallel to the central axis of the discharge tube 2200 and having the first radius of curvature, and an interlayer capacitor electrically connecting the first layer antenna and the second layer antenna.

In the plasma processing system 10, the first layer antenna of the first plasma generator 2001 may be electrically connected to the first end of the inverter 1300, the second layer antenna of the first plasma generator 2001 may be electrically connected to the first layer antenna of the second plasma generator 2002, the second layer antenna of the second plasma generator 2002 may be electrically connected to the first layer antenna of the third plasma generator 2003, the second layer antenna of the third plasma generator 2003 may be electrically connected to the first layer antenna of the fourth plasma generator 2004, and the second layer antenna of the fourth plasma generator 2004 may be electrically connected to the second end of the inverter 1300. The first end of the inverter 1300 and the first layer antenna of the first plasma generator 2001 may be electrically connected through a capacitive element. Similarly, the second layer antenna of the first plasma generator 2001 and the first layer antenna of the second plasma generator 2002, the second layer antenna of the second plasma generator 2002 and the first layer antenna of the third plasma generator 2003, the second layer antenna of the third plasma generator 2003 and the first layer antenna of the fourth plasma generator 2004, and the second layer antenna of the fourth plasma generator 2004 and the second end of the inverter 1300 may be electrically connected through a capacitive element.

Beside the example described above, the antenna structure 2100 may include a plurality of antennas constituting a plurality of turns and/or a plurality of layers, and a plurality of capacitors electrically connecting the plurality of antennas.

As described above, since the antenna structure 2100 includes both an inductive element and a capacitive element, the voltage that is applied to the inductive element in each of the plasma generators 2000 can be prevented from excessively increasing even through the plasma generators

2000 are connected in series, whereby stability of the plasma that is induced in the plasma generators 2000 can be improved.

(4) Fourth Embodiment

Figure 9:
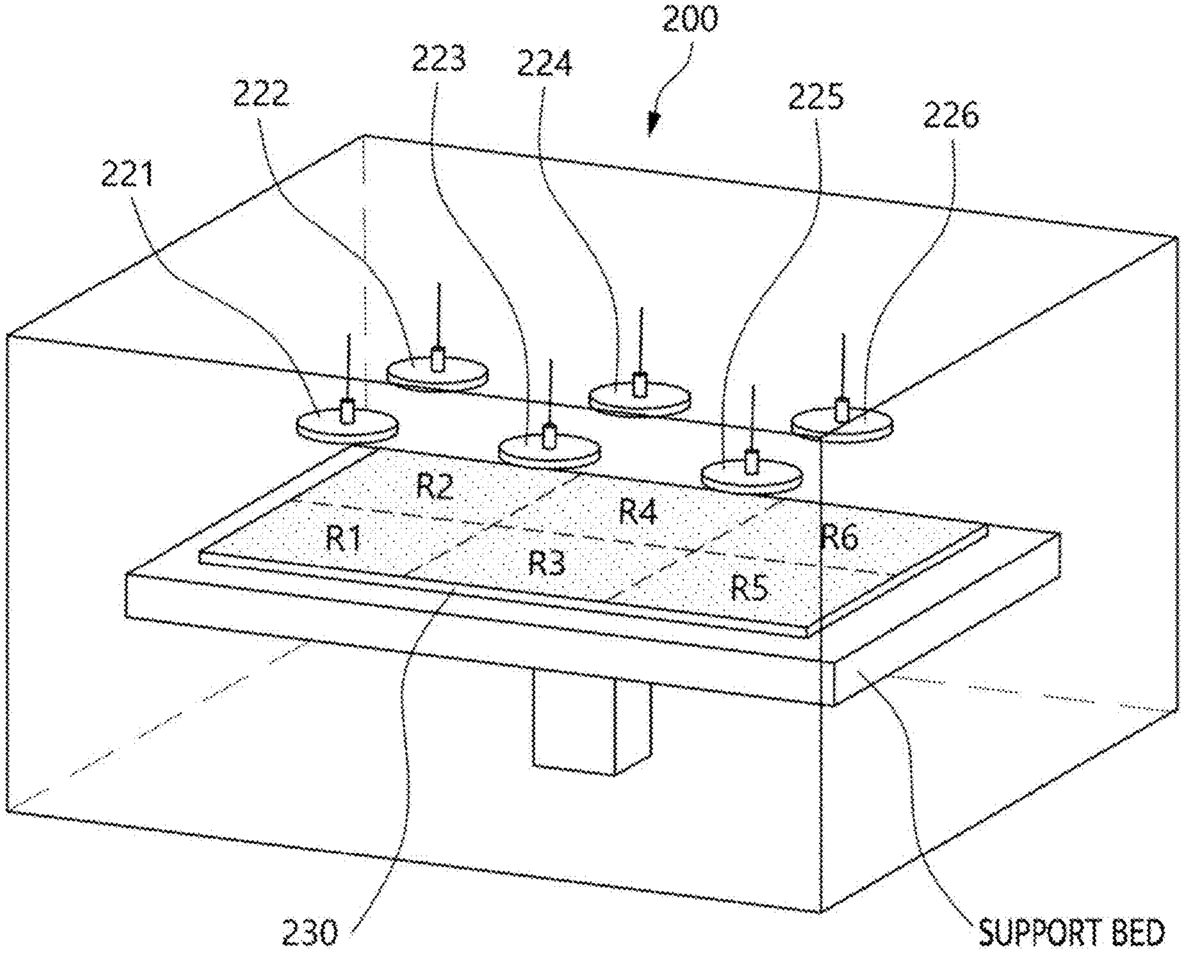
FIGS. 9 and 10 are views showing a system of plasma processing for a multi-station according to another embodiment of the present disclosure.
Figure 10:
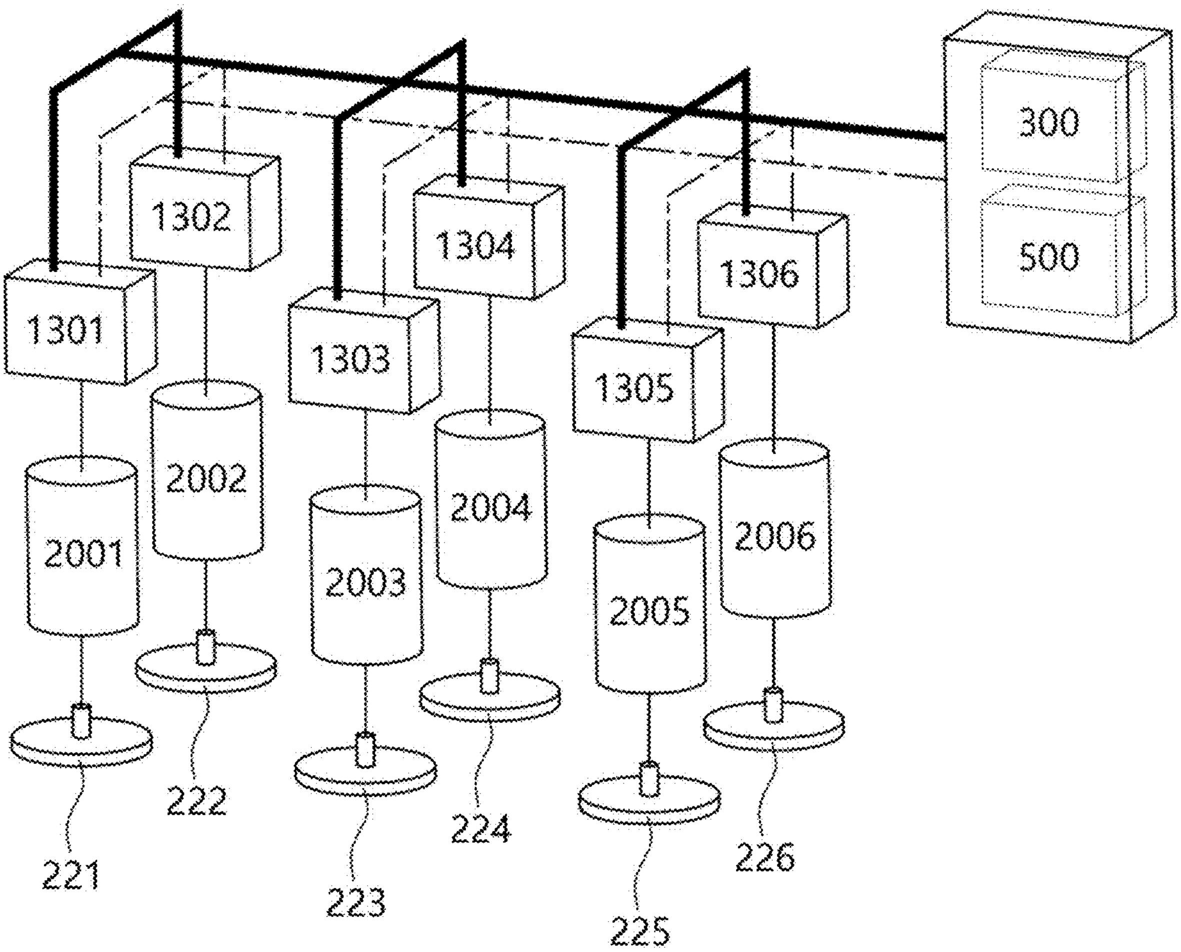

FIGS. 9 and 10 are views showing a plasma processing system 10 for a multi-station according to another embodiment of the present disclosure.

The plasma processing system 10 may be implemented in other shapes in accordance with the size of an object to which plasma processing is performed. For example, as a display process using plasma, when deposition, etching, or washing is performed on a large glass substrate, several plasma generation systems 100 may be required, considering the process requirement region of the large glass substrate. Of course, it may be possible to make a plasma generation system 100 large to correspond to the process requirement region of the large glass substrate, but using several plasma generation systems 100 can make the process uniform and can reduce the manufacturing costs of the systems.

Hereafter, the case in which plasma processing is performed on a large glass substrate in a display process is described, but the technical ideas of the present disclosure are not limited thereto. Repeated configurations as those described above in the following description may be omitted unless there is configuration that has to be additionally described.

The substrate 230 that is disposed in the processing chamber 200 may be divided into a plurality of process regions. For example, referring to FIG. 9, the substrate 230 may be divided into first to sixth process regions R1, R2, R3, R4, R5, and R6. Process regions are freely determined to discriminate regions on which plasma processing has to be performed, and are not physically shown and discriminated on the substrate 230. The number of process regions of the substrate 230 may correspond to the number of the heads 220 in the processing chamber 200.

Hereafter, the case in which the substrate 230 is divided into six process regions is described for the convenience of description, but the substrate 230 may be divided into other numbers of process regions having other shapes, depending on the size or shape of the substrate 230.

The processing chamber 200 may include heads 220 corresponding to the process regions of the substrate 230, respectively. For example, the processing chamber 200 may include a first head 221 corresponding to a first process region R1. When the first head 221 corresponds to the first process region R1, a process can be sufficiently performed on the first procession region R1 by a process gas flowing inside through the first head 221.

Referring to FIG. 10, the plasma processing system 10 may include first to sixth inverters 1301, 1302, 1303, 1304, 1305, and 1306 corresponding to the first to six heads 221, 222, 223, 224, 225, and 226 in the processing chamber 200, respectively, first to sixth plasma generators 2001, 2002, 2003, 2004, 2005, and 2006, a power distributor 300, and a central controller 500. Those described with reference to FIG. 6, 7, or 8 may be equally applied to the detailed connection relationships of the components.

The first to sixth inverters 1301, 1302, 1303, 1304, 1305, and 1306 and the first to sixth plasma generators 2001, 2002, 2003, 2004, 2005, and 2006 may be classified and controlled in different groups. For example, the first to third inverters 1301, 1302, and 1303 and the first to third plasma generators 2001, 2002, and 2003 may be classified into a first group, and the fourth to sixth inverters 1304, 1305, and 1306 and the fourth to sixth plasma generators 2004, 2005, and 2006 may be classified into a second group. The power distributor 300 may include a first power distributor proving power to the first group and a second power distributor providing power to the second group. The central controller 500 may include a first central controller providing a switch signal to the inverters in the first group and a second central controller providing a switch signal to the inverters in the second group.

4. Method of Multi-Station

Hereafter, a method of controlling a plasma processing system 10 for a multi-station is described with reference to FIGS. 11 and 12. It is assumed in the control method to be described hereafter that a plasma processing system 10 for a multi-station is implemented in the structure shown in FIG. 6, but the technical ideas of the present disclosure are not limited thereto, and the method may be similarly applied even though the structure of the plasma processing system 10 is implemented in structures slightly modified from the structures shown in FIGS. 7, 8, and 9 or FIGS. 6 to 9.

(1) Power Control Method

Figure 11:
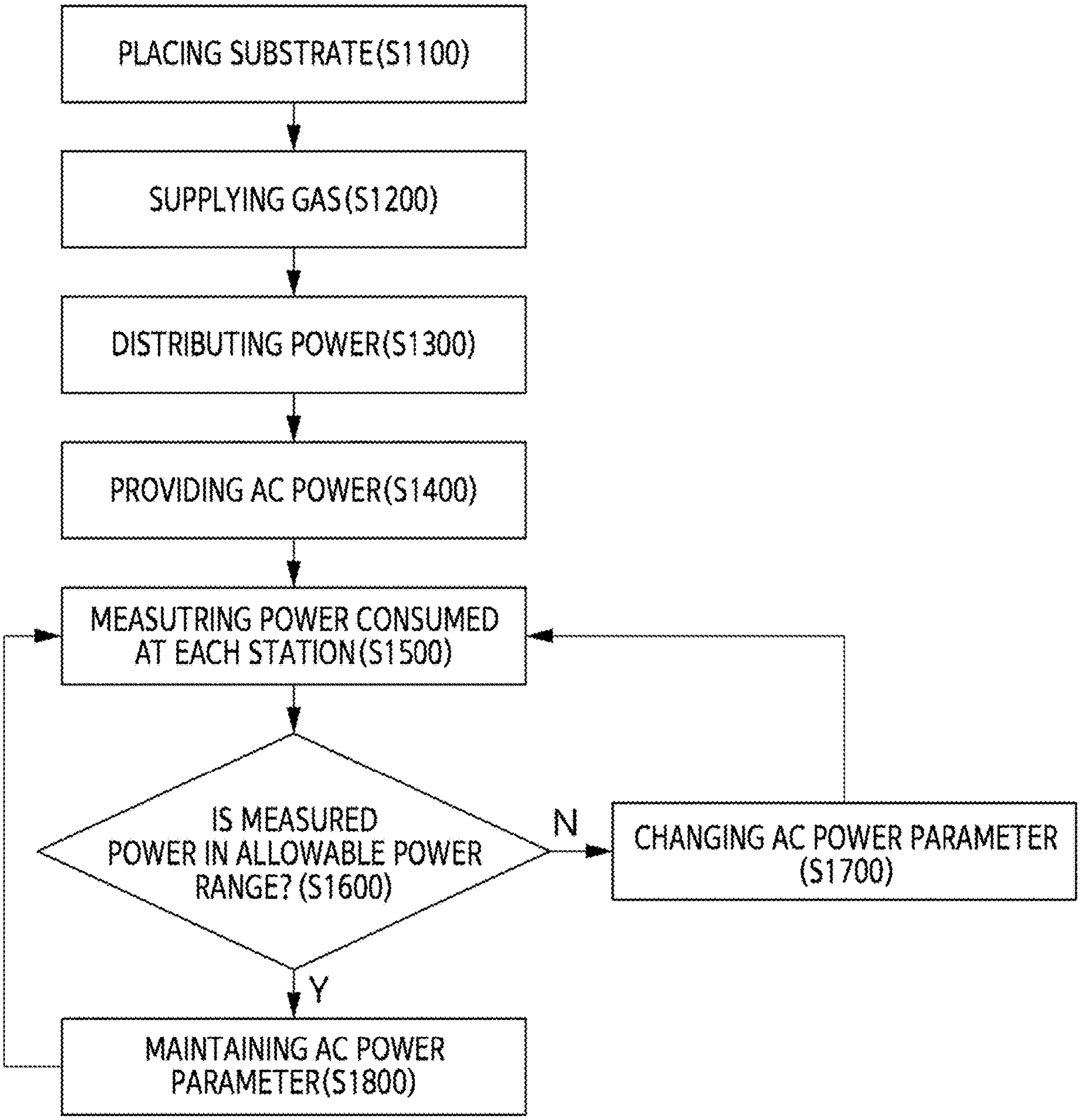
FIG. 11 is a view showing a method of controlling power in a system of plasma processing for a multi-station according to an embodiment of the present disclosure.

FIG. 11 is a view showing a method of controlling power in a plasma processing system 10 for a multi-station according to an embodiment of the present disclosure.

Referring to FIG. 11, the power control method may include a substrate disposition step S1100, a gas supply step S1200, a power distribution step S1300, an AC power provision step S1400, a power measurement step S1500, a power condition determination step S1600, an AC power parameter change step S1700, and an AC power parameter maintenance step S1800.

Hereafter, these steps are described in detail.

In the substrate disposition step S1100, a substrate 230 may be disposed at each of stations. For example, the system controller receives user input and controls the robot arm on the basis of the received user input, thereby being able to place a substrate 230 prepared for a process onto a substrate holder at each of the stations. The system controller can place the substrate 230 at a station, in which plasma processing is performed, of the first to fourth stations 211, 212, 213, and 214.

In the gas supply step S1200, gas can be supplied to the stations and/or plasma generators 2000. For example, the system controller can control the gas generator such that gas required for a process is supplied to the first to fourth stations 211, 212, 213, and 214. The system controller can control the gas supplier such that gas required to form plasma and gas for a process are supplied to the first to fourth plasma generators 2001, 2002, 2003, and 2004.

In the power distribution step S1300, the power distributor 300 can distribute power to the inverters 1300. For example, the power distributor 300 can be supplied power from the power supplier of the plasma processing system 10 or an external power supplier and can distribute the power to the first to fourth inverters 1301, 1302, 1303, and 1304.

The power distributor 300 can provide power having a magnitude required for plasma processing that is performed at each of the stations to the inverters 1300, respectively. For example, the power distributor 300 provides first power required for first plasma processing that is performed at the first station 211 to the first inverter 1301 and provides second power required for second plasma processing that is performed at the second station 212 to the second inverter 1302, in which when the first plasma processing and the second plasma processing are different, the first power and the second power may be different. Otherwise, the power provided by the power distributor 300 may be same for each inverter.

The power distributor 300 may selectively provide power to the inverters 1300, if necessary. For example, the power distributor 300 may provide power to only the inverter 1300 corresponding to a station at which plasma processing is performed of the stations. As another example, the power distributor 300 can receive data related to power that is consumed by each of the inverters 1300 from the partial power measuring unit and can stop supplying power to inverters 1300 with a problem.

In the AC power provision step S1400, the inverter 1300 can provide AC power to the plasma generator 2000. For example, the first inverter 1301 can acquire first DC power from the power distributor 300 and apply first AC power having a first driving frequency to the first plasma generator 2001.

The AC power that is provided by the inverters 1300 may have different driving frequencies. For example, the first inverter 1301 may apply first AC power having a first driving frequency to the first plasma generator 2001 and the second inverter 1302 may apply second AC power having a second driving frequency to the second plasma generator 2002. In other words, AC power having different driving frequencies can be applied to plasma generators 2000, respectively, and accordingly, as will be described below, it is possible to individually control a frequency at the stations.

In the power measurement step S1500, the partial power measuring unit can measure power that is consumed as plasma processing is performed at each of the stations. For example, the first partial power measuring unit 421 can measure power that is consumed as first plasma processing is performed at the first station 211. The first partial power measuring unit 421 can provide partial power measurement data related to the measured power to the power distributor 300 and/or the central controller 500.

In the power measurement step S1500, the entire power measuring unit 430 can measure power that is consumed at all of the stations. For example, the entire power measuring unit 430 can transmit total power data, which are acquired by measuring power that is consumed by the first to fourth inverters 1301, 1302, 1303, and 1304 and the first to fourth plasma generators 2001, 2002, 2003, and 2004, to the power distributor 300 and/or the central controller 500.

In the power condition determination step S1600, the central controller 500 can determine whether measured power is in an allowable power range. The allowable power range may mean a reference power range set for a station. The allowable power range may be set based on power or the amount of power targeted in the plasma generation system 100. The allowable power range may be set different for each station or each plasma processing that is performed.

For example, the central controller 500 can compare first partial power consumption data of the first inverter 1301 and the first plasma generator 2001 measured in the power measurement step S1500 with a first allowable power range. The central controller 500 can maintain the magnitude or amount of AC power when the first partial power data are in the first allowable power range, and can control the first inverter 1301 and/or the power distributor 300 such that the magnitude or amount of the first power that is applied to the first plasma generator 2001 is changed when the first partial power data are out of the first allowable power range.

The power condition determination step S1600 may be performed at the power distributor 300 or the system controller. Otherwise, the power condition determination step S1600 may be performed by a sub controller corresponding to each station.

In the AC power parameter change step S1700, the central controller 500 can change parameters of the AC power that is applied to the plasma generator 2000. The AC power parameters may mean power, a power amount, a voltage, a current, etc. that are applied to the plasma generator 2000.

The central controller 500 can change the pattern of applying AC power for the plasma generator 2000 to change the parameters of the AC power that is applied to the plasma generator 2000.

For example, the central controller 500 can change the parameters of the AC power that is applied to the plasma generator 2000 using a powering operation and a freewheeling operation. The powering operation may mean an operation of applying AC power to the plasma generator 2000 for a preset time and the freewheeling period may mean an operation of not applying AC power to the plasma generator 2000 for a preset time. The central controller 500 can control intensity or amount per unit time of AC power that is applied to the plasma generator 2000 by repeating the powering operation and the freewheeling operation in a specific pattern. In detail, in order to reduce the power amount or power per unit time that is applied to the plasma generator 2000, the central controller 500 can continuously perform the freewheeling operation or can increase the ratio of the freewheeling operation more than the powering operation for a predetermined period. The central controller 500 can perform the powering operation or the freewheeling operation using a switch signal that is provided to the inverter 1300.

Meanwhile, the AC power parameter change step S1700 may be performed by the power distributor 300. For example, the power distributor 300 may change the magnitude of power that is provided to the inverter 1300.

The AC power parameter change step S1700 may be performed by the system controller. For example, the operation of controlling power parameters by the central controller 500 described above may be performed by the system controller.

In the AC power parameter maintenance step S1800, the parameters of the AC power that is applied to the plasma generator 2000 can be maintained. For example, the central controller 500 may maintain a switch signal that is applied to the inverter 1300. However, as will be described below, when a driving frequency needs to be changed, the central controller 500 can change a switch signal that is applied to the inverter 1300.

In the AC power parameter maintenance step S1800, when a specific condition is satisfied, for example, a predetermined time elapses, the method can enter the power measurement step S1500, whereby the AC power that is applied to the plasma generator 2000 can be controlled on the basis of power that is consumed in real time or periodically by the inverter 1300 and the plasma generator 2000.

When using the power control method described above, it is possible to control power individually at the stations of the plasma processing system 10, and station-fit management may be performed for the stations, respectively, even though different plasma processing is performed at the stations.

(2) Frequency Control Method

Figure 12:
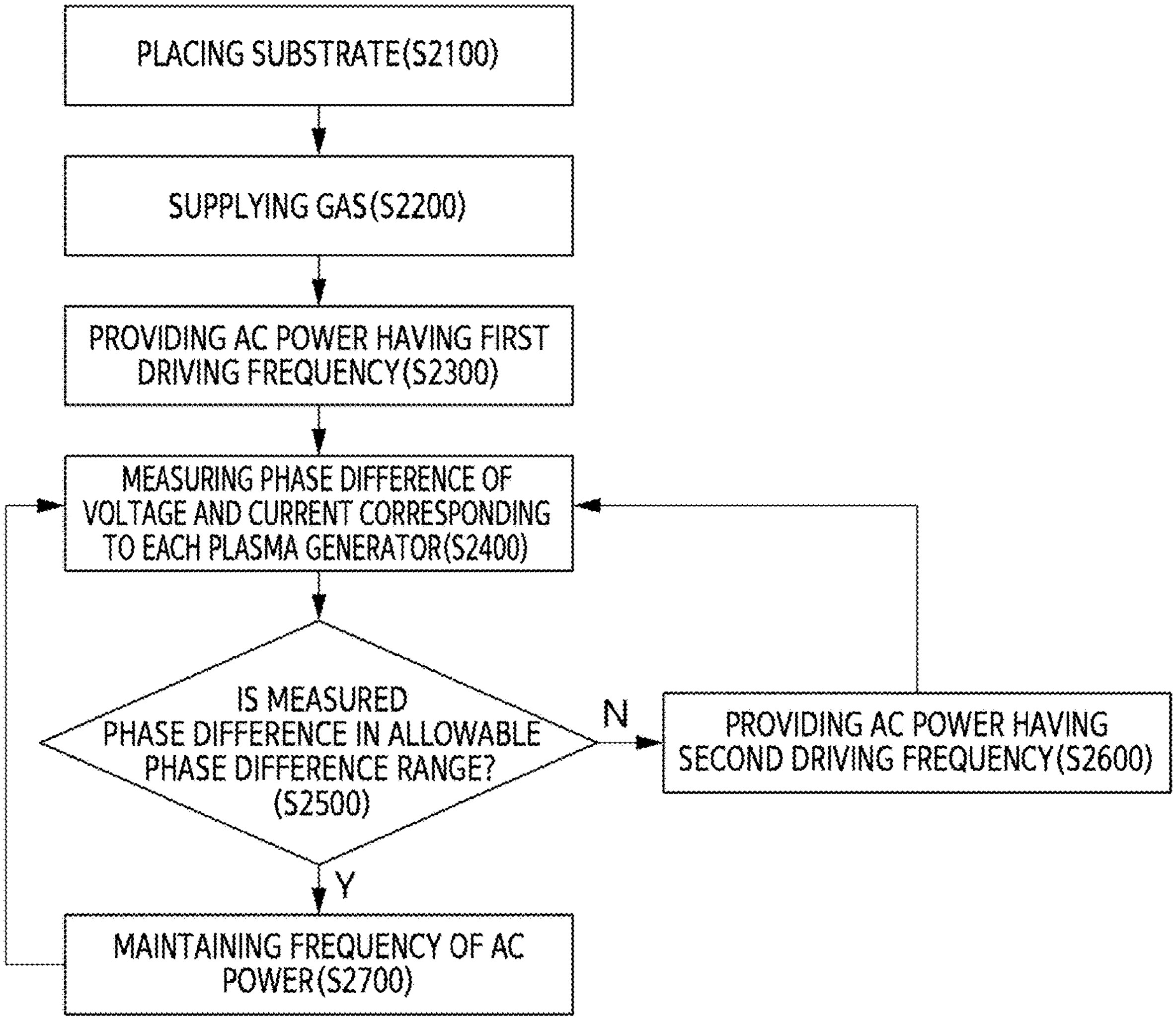
FIG. 12 is a view showing a method of controlling a frequency in a system of plasma processing for a multi-station according to an embodiment of the present disclosure.

FIG. 12 is a view showing a method of controlling a frequency in a plasma processing system 10 for a multi-station according to an embodiment of the present disclosure.

Referring to FIG. 12, the frequency control method may include a substrate disposition step S2100, a gas supply step S2200, an AC power provision step S2300, a phase difference measurement step S2400, a phase difference condition determination step S2500, a frequency change step S2600, and a frequency maintenance step S2700.

Hereafter, these steps are described in detail.

The substrate disposition step S2100 and the gas supply step S2200 are applied in the same way as in FIG. 11.

In the AC power provision step S2300, the central controller 500 can provide AC power having a specific driving frequency to the plasma generator 2000 using the inverter 1300. In detail, the driving frequency of AC power that is provided from the inverter 1300 may correspond to a switch signal that is provided from the central controller 500 to the inverter 1300. In other words, the frequency of AC power that that the inverter 1300 provides to the plasma generator 2000 can be controlled in accordance with a switch signal that is provided from the central controller 500 to the inverter 1300.

For example, the central controller 500 can provide a first switch signal to the first inverter 1301 and the first inverter 1301 can provide AC power having a first driving frequency to the first plasma generator 2001 based on the first switch signal.

The central controller 500 can increase or decrease the driving frequency of the AC power that is provided from the inverter 1300 based on a phase difference measured in the phase difference measurement step S2400 to be described below.

In the phase difference measurement step S2400, the central controller 500 can acquire data related to the phase difference of a voltage and a current that are applied to each plasma generator 2000.

For example, the central controller 500 can acquire first phase difference data by comparing first current phase data related to the phase of a current that is applied to the first plasma generator 2001 and first voltage phase data related to the phase of a voltage that is applied to the first plasma generator 2001. To this end, the first phase measuring unit 411 can measure the phase of a current that is applied from the first plasma generator 2001 and provide first current phase data to the central controller 500, and the central controller 500 can acquire first voltage phase data related to the phase of a voltage that is applied to the first plasma generator 2001 on the basis of a first switch signal provided to the first inverter 1301.

In the phase difference condition determination step S2500, the central controller 500 can determine whether the phase difference data acquired in the phase difference measurement step S2400 are in an allowable phase difference range.

The allowable phase difference range may be understood as a reference for maintaining induced plasma in the plasma generation system 100. In detail, the resonance frequency (or impedance) of the plasma generator 2000 may be changed by plasma formed when plasma is induced in the plasma generation system 100, and the larger the difference between the resonance frequency of the plasma generator 2000 and the driving frequency of AC power that is provided from the inverter 1300, the lower the power that is transmitted to the plasma generator 2000, so the plasma may not be maintained. Accordingly, in order to form and maintain plasma, it is required to continuously monitor the difference between the resonance frequency of the plasma generator 2000 and the driving frequency of AC power that is provided from the inverter 1300, and to control the driving frequency of the inverter 1300 in order to prevent an increase of the difference, and an allowable phase difference range may be set under this condition.

The allowable phase difference range may be set different for stations. For example, when the plasma processing that is performed at the first station 211 and the second station 212 is different or the process environments are different, a first allowable phase difference range at the first station 211 may be different from a second allowable phase difference range at the second station 212.

The central controller 500 can compare phase difference data and an allowable phase difference range. For example, the central controller 500 can acquire first phase difference data related to the first inverter 1301 and the first plasma generator 2001, can maintain the first driving frequency of first AC power that is applied to the first plasma generator 2001 when the first phase difference data are in a first allowable phase difference range, and can change the first driving frequency of the first AC power that is applied to the first plasma generator 2001 into a second driving frequency when the first phase difference data are out of the first allowable phase difference range.

In the frequency change step S2600, the central controller 500 can change the driving frequency of AC power that is applied to the plasma generator 2000 by controlling the inverter 1300. For example, when it is required to change a driving frequency while applying a first switch signal corresponding to a first driving frequency to the first inverter 1301, the central controller 500 can apply a second switch signal corresponding to a second driving frequency different from the first driving frequency to the first inverter 1301.

The central controller 500 can increase or decrease the driving frequency of the AC power that is provided from the inverter 1300 based on phase difference data acquired in the phase difference measurement step S2400 described above. When phase difference data represent that the phase of a voltage that is applied to the plasma generator 2000 is earlier than the phase of a current, the central controller 500 can decrease the driving frequency of AC power that is provided from the inverter 1300. However, when phase difference data represent that the phase of a voltage that is applied to the plasma generator 2000 is later than the phase of a current, the central controller 500 can increase the driving frequency of AC power that is provided from the inverter 1300.

In the frequency maintenance step S2700, the frequency of AC power that is applied to the plasma generator 2000 can be maintained. For example, the central controller 500 may maintain rather than change a switch signal that is applied to the inverter 1300. However, as described above, when it is required to change AC power parameters, the central controller 500 can change a switch signal that is applied to the inverter 1300.

In the frequency maintenance step S2700, when a specific condition is satisfied, for example, a predetermine time elapses, the method can enter the phase difference measurement step S2400, and accordingly, it is possible to control the phase difference between a current and a voltage that are applied in real time or periodically to the plasma generator 2000 within an allowable range.

When using the frequency control method described above, it is possible to individually control a frequency at stations of the plasma processing system 10, and as a result, it is possible to increase the efficiency of plasma processing that is performed at each station. In particular, when plasma is induced in several plasma generators 2000, the periods of variation of the resonance frequency (or impedance) of the plasma generators 2000 are unavoidably different, so it is necessary to individually monitor and manage the plasma generators 2000 using the frequency control method described above.

Meanwhile, the power control method and the frequency control method described above may be performed sequentially or in parallel. For example, after a substrate is placed and gas is supplied in the plasma processing system 10, the central controller 500 can perform the power control method and the frequency control method sequentially or in parallel. As another example, the central controller 500 can perform the power control method first and then the frequency control method. As another example, the central controller 500 can perform the frequency control method first and then the power control method.

5. Implementation of Plasma Generating System (1) Overall Circuit Design

Hereinafter, referring to FIG. 13 and FIG. 14, an implementing method of the plasma generating system 100 according to an embodiment is described. Here, the plasma generating system 100 would be described as performing the plasma processing in four stations, the technical ideas of the present disclosure is not limited thereto.

Figure 13:
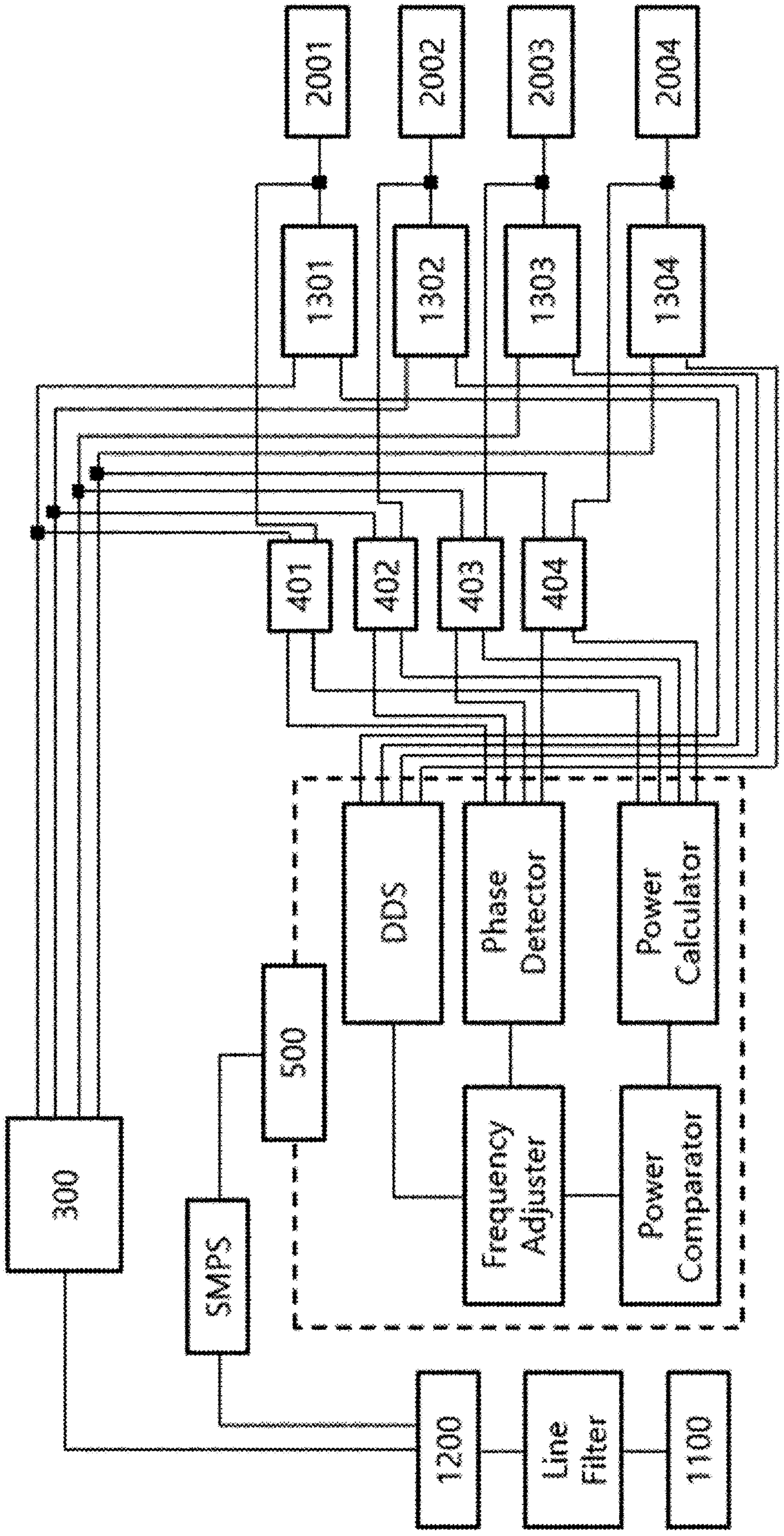
FIG. 13 is a view showing a block diagram of the plasma generation system according to an embodiment of the present disclosure.

FIG. 13 is a view showing a block diagram of the plasma generation system 100 according to an embodiment of the present disclosure.

Referring to FIG. 13, the plasma generation system may include the AC power source 1100, line filter, the rectifier 1200, SMPS (Switching Mode Power Supply), the power distributor 300, and the central controller 500.

Description of the AC power source 1100 and the rectifier 1200 would be skipped as it is same as described above. The power distributor 300 may receive DC power from the AC power source 1100 as it is electrically connected with the rectifier 1200.

Line filter performs a role of removing noise as it is electrically interposed between the AC power source 1100 and the rectifier 1200, and SMPS may perform a role of providing power for the central controller 500 to be operated, by using power rectified by the rectifier 1200.

Also, referring to FIG. 13, the plasma generation system 100 may include a first to a fourth partial sensing unit 401, 402, 403, 404, a first to a fourth inverter 1301, 1302, 1303, 1304, and a first to a fourth plasma generator 2001, 2002, 2003, 2004. Each inverter may be electrically connected to respective plasma generator and each of the partial sensing units may measure electric characteristic related to each inverter. For example, the first inverter 1301 provides power to the first plasma generator 2001, the first partial sensing unit 401 may measure power applied to the first inverter 1301, phase of current flowing in the first plasma generator 2001.

Referring to FIG. 13, the central controller 500 may include frequency adjuster, phase detector, power calculator, power comparator, and DDS (Direct Digital Synthesis).

The phase detector may acquire phase difference data. The phase detector may acquire the phase difference data between current and voltage by using a current signal obtained from the sensing unit 400 and a voltage signal outputted from the DDS. Here, phase difference data may imply data corresponding to phase difference of voltage and current applied to the load as described before.

The Phase detector may acquire phase difference data for each of the plasma generators of each of the stations. For example, the phase detector may acquire first phase difference data for the first plasma generator 2001 of the first station.

The phase detector may provide the phase difference data to the frequency adjuster.

The power calculator may acquire power consumption data. The power consumption data may imply data for consumed power in the inverter 1300 and the plasma generator 2000.

The power calculator may acquire the power consumption data by using voltage data and current data obtained from the sensing unit 400.

The power calculator may calculate power consumed in each station. For example, the power calculator may calculate first consumed power consumed in the first inverter 1301 and/or the first plasma generator 2001 by using first current data and first voltage data applied to the first inverter 1301, which is obtained through the first sensing unit 401. Here, power consumption data calculated for each station may have different values.

The power calculator may provide the power consumption data to the power comparator.

The power comparator may compare the power consumption data and target power data. The power comparator may acquire power comparison data by comparing the power consumption data and the target power data.

Here, the power consumption data may represent power consumed in inverter 1300 and/or plasma generator. Or, the power consumption data may represent power applied to the inverter 1300 and/or the plasma generator.

Here, target power data may represent power need to be consumed in inverter 1300 and/or plasma generator. Or, the target power data may represent power need to be applied to the inverter 1300 and/or the plasma generator.

The power comparator may compare consumed power and target power for each station. For example, the power comparator may acquire first power comparison data by comparing first power consumption data of the first station and first target power.

Here, the power comparison data calculated for each station may have different values.

Here, target power set for each station may be determined according to a type of process performed in each station or an equipment or target used in each station. Target power set for each station may have different or same values.

The power comparator may provide the power comparison data to the frequency adjuster.

The frequency adjuster may calculate a driving frequency. The frequency adjuster may calculate the driving frequency based on the phase difference data and the power comparison data. For a method how the frequency adjuster calculates the driving frequency will be described in detail at FIG. 16 and FIG. 17.

The frequency adjuster may calculate the driving frequency for each station. For example, the frequency adjuster receive first phase difference data from the phase detector, receive first power comparison data from the power comparator, and calculate a first driving frequency by using the first phase difference data and the first power comparison data. Here, the driving frequency calculated for each station may have different values.

The frequency adjuster may provide the driving frequency to the DDS.

The DDS may provide a signal corresponding to the driving frequency to each inverter. For example, the DDS may provide a first signal corresponding to a first driving frequency to the first inverter 1301, and the DDS may provide a second signal corresponding to a second driving frequency to the second inverter 1302. Here, the first driving frequency and the second driving frequency may be different from each other.

The DDS may determine the signal to output by receiving data related to the driving frequency from the frequency adjuster. For example, the DDS may obtain the driving frequency from the frequency adjuster and output the signal corresponding to the obtained driving frequency.

(2) Design for Sensing Circuit

Figure 14:
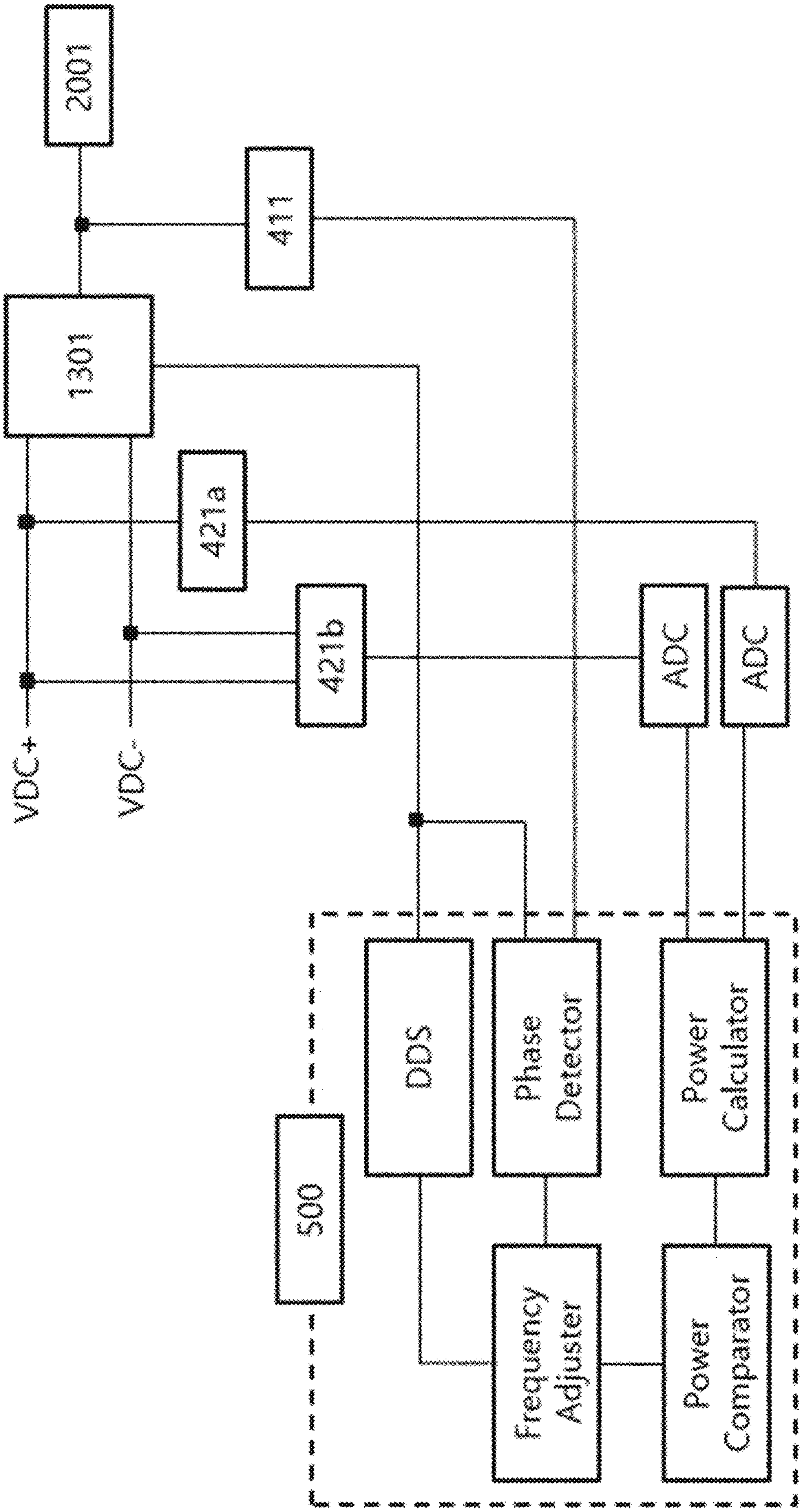
FIG. 14 is a view showing a process of acquiring a sensing value from the central controller according to an embodiment of the present disclosure.

FIG. 14 is a view showing a process of acquiring a sensing value from the central controller 500 according to an embodiment of the present disclosure. In FIG. 14, only a circuit for acquiring a sensing value for one station or one plasma generator is shown for convenience of description. In other words, a process of acquiring a sensing value shown in FIG. 14 is a process acquiring sensing values for the first inverter 1301 and the first plasma generator 2001, and the same circuit may be configured for other inverter and plasma generator.

Referring to FIG. 14, the first sensing unit 401 may include first partial current measuring unit 421*a*, a first partial voltage measuring unit 421*b*, and a first phase measuring unit 411.

The first partial current measuring unit 421*a* may be electrically interposed between the first inverter 1301 and the power calculator. The first partial current measuring unit 421*a* may measure current applied to the first inverter 1301 and provide it to the power calculator. ADC (Analog-to Digital Converter) may be arranged between the first partial current measuring unit 421*a* and the power calculator in order for changing an analog signal measured in the first partial current measuring unit 421*a* to a digital signal.

The first partial voltage measuring unit 421*b* may be electrically interposed between the first inverter 1301 and the power calculator. The first partial measuring unit 421*b* may measure potential difference between both ends of the first inverter 1301 and provide it to the power calculator. ADC may be arranged between the first partial voltage measuring unit 421*b* and the power calculator in order for changing an analog signal measured in the first partial voltage measuring unit 421*b* to a digital signal.

The first phase measuring unit 411 may be coupled to a first conducting wire between the first inverter 1301 and the first plasma generator 2001. One end of the first phase measuring unit 411 may be coupled to the first conducting wire and other end of the first phase measuring unit 411 may be electrically connected to the phase detector.

Meanwhile, the phase detector may receive a first signal outputted from the DDS to the first inverter 1301. The phase detector may detect phase of voltage by using the first signal outputted from the DDS to the first inverter 1301, and generate the phase difference data by using phase data of current obtained from the first phase measuring unit 411.

(3) Power Control Method

Hereinafter, referring to FIG. 15 to FIG. 17, a method of controlling power applied to each station in the multi-station according to one embodiment.

Figure 15:
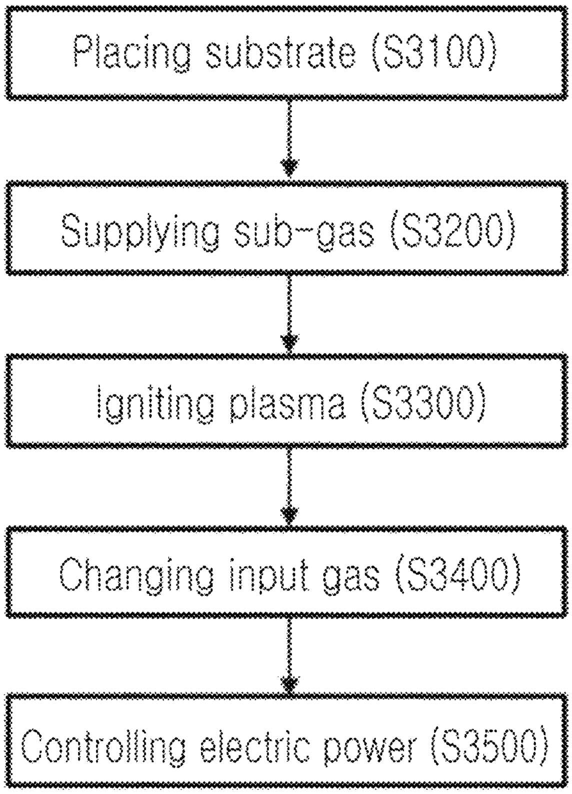
FIG. 15 is a flowchart showing a method of plasma processing using plasma generating system according to an embodiment of the present disclosure.

FIG. 15 is a flowchart showing a method of plasma processing using the plasma generation system 100 according to an embodiment of the present disclosure.

Referring to FIG. 15, the method of plasma processing may include a step of placing a substrate 53100, a step of supplying sub-gas S3200, a step of igniting plasma S3300, a step of changing input gas S3400, and a step of controlling electric power S3500.

Each of steps will be explained below. The method of plasma processing may be independently performed in stations different from each other among the multi-stations. Also, the method of plasma processing may be performed in different stations at the same time or at different times.

In case of the step of placing the substrate 53100, it is skipped to describe as it is same as the substrate disposition step S1100 described in FIG. 11.

After a target for the plasma process is placed, a sub-gas may be supplied to the plasma generator 2000 (S3200). Here, the sub-gas may be interpreted as gas for igniting plasma. For example, the sub gas may be Argon gas.

Plasma may be ignited by the plasma generator 2000 (S3300). For the ignition of plasma, the plasma generator 2000 may further include DC electrode and/or the ignition coil described above.

And then, gas inputted to the plasma generator 2000 may be changed (S3400). Here, the changed gas can be interpreted as gas for the plasma process. For example, the gas can be NF3 when the plasma process is used for cleaning. In addition, the gas to be changed may be O2, N2, NH3, and/or H2 according to a purpose of the plasma process.

A time point when the input gas is changed can be later than a time point when plasma is ignited. Or, the time point when the input gas is changed may be after predetermined time (ex. 3 seconds to 5 seconds) from after power is applied to the plasma generator 2000 for plasma ignition. Or, the input gas may be changed when the ignition of plasma is detected, and the ignition of plasma may be detected based consumed power in the plasma generator 2000.

At this time, a driving frequency of AC power the inverter 1300 applies to the plasma generator 2000 for the ignition of plasma may be maintained as a constant value. In other words, in a process of igniting plasma, the power control method by adjusting frequency described below may not be used.

The plasma process may be performed as plasma is maintained after the input gas is changed.

While plasma is maintained, power consumed in the plasma generator 2000 may be controlled (S3500). The central controller 500 may be changed the consumed power in the plasma generator 2000 as changing a parameter of AC power applied to the plasma generator 2000.

For example, the central controller 500 may control power applied to the plasma generator 2000 through the inverter 1300 by using the powering operation or freewheeling operation as described above.

On the one hand, even though the power control through the powering operation and freewheeling operation has an advantage that precise power control is possible, complexity of a circuit for implementing the inverter 1300 relatively increases and resources of the central controller 500 for handling control signals also increases. This may act as a great burden in terms of system design as a number of stations increases when there are multiple stations instead of one, which is when the plasma process is performed at multi-stations.

As a way to compensate for this disadvantage, the central controller 500 may change the driving frequency of the AC power applied to each plasma generator 2000, and the AC power applied to each plasma generator 2000 or the consumed power in each plasma generator 2000.

A basic algorithm of the power control through adjustment of frequency is as follows.

The consumed power in the plasma generator 2000 may change according to difference of a resonant frequency of the plasma generator 2000 and the driving frequency and phase difference between voltage and current applied to the plasma generator 2000. For example, the consumed power in the plasma generator 2000 may increase as phase of voltage applied to the plasma generator 2000 and phase of current applied to the plasma generator 2000 become the same.

In addition, when the phase of voltage applied to the plasma generator 2000 precedes the phase of current applied to the plasma generator 2000, as the driving frequency increases, imaginary part of impedance of the plasma generator 2000 increases so that output current decreases, and power consumed by the plasma generator 2000 gets reduced as a result. Conversely, as the driving frequency decreases, the imaginary part of the impedance of the plasma generator 2000 decreases so that the output current increases, and power consumed by the plasma generator 2000 gets increased as a result.

Hereinafter, referring to FIG. 16 and FIG. 17, a method of controlling power applied to the plasma generator 2000 or power consumed in the plasma generator 2000 by adjusting frequency.

Figure 16:
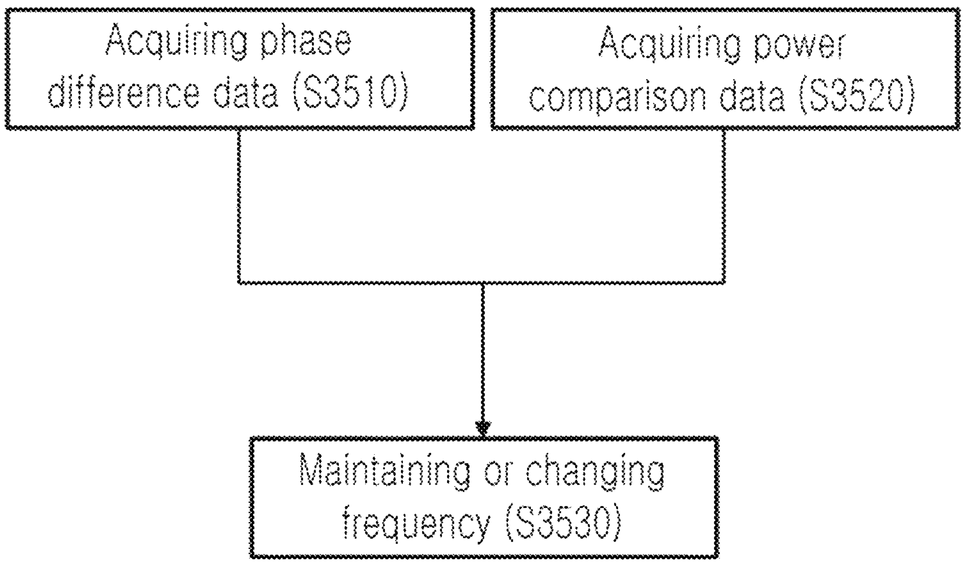
FIG. 16 is a flowchart showing power control method through frequency control according to an embodiment of the present disclosure.

FIG. 16 is a flowchart showing power control method through frequency control according to an embodiment of the present disclosure.

Referring to FIG. 16, the power control method through adjusting frequency may include a step of acquiring phase difference data S3510, a step of acquiring power comparison data S3520, and a step of maintaining or changing frequency S3530.

The central controller 500 may acquire phase difference data of voltage and current applied to the plasma generator 2000. For example, phase detector of the central controller 500 may obtain phase difference data based on a voltage signal and a current signal obtained from the sensing unit 400.

The central controller 500 may obtain the power comparison data S3520.

First of all, the power calculator of the central controller 500 may calculate power consumed in the plasma generator 2000 directly or indirectly. For example, the power calculator may obtain a signal of voltage and current applied to the plasma generator 2000 and may measure consumed power in the plasma generator 2000. For other example, the power calculator may obtain a signal of voltage applied to the inverter 1300 and a signal of current flowed in the plasma generator 2000, and may calculate power consumed in the plasma generator 2000. In order to calculate power, the power calculator may receive data for electric characteristic from the sensing unit 400 as described above.

The power comparator of the central controller 500 may compare measured power calculated from the power calculator and target power.

The step of acquiring phase difference data S3510 and the step of acquiring power comparison data described above may be performed in parallel. Alternatively, one step may be performed before another step.

The central controller 500 may maintain or change frequency of AC power applied to the inverter 1300 (S3530).

The central controller 500 may adjust the frequency based on a specific rule. Here, the specific rule may be based on, for example, the aforementioned phase difference data and power comparison data.

Hereinafter, referring FIG. 17, the specific rule according to one embodiment is described.

FIG. 17 is a view showing a table summarizing rules used in the power control method through frequency control according to an embodiment of the present disclosure.

Here, the phase difference data is the phase of voltage relative to the phase of the current, which can be interpreted as follows: it is a case of 'lagging' when the phase difference data is positive (+), which means that the phase of current is later than the phase of voltage; it is a case of 'leading' when the phase difference data is negative (–), which means the phase of current is faster than the phase of voltage.

In addition, the power comparison data is a value obtained by subtracting the measured power from the target power so that the target power is bigger than the measured power when the power comparison data is positive (+) and the target power is smaller than the measured power when the power comparison data is negative (–).

Meanwhile, the phase difference data and the power comparison data are not limited to be interpreted as above description.

Referring to FIG. 17, the central controller 500 may determine the driving frequency as follows.

When the phase difference data is 0 and the power comparison data is positive (+) or 0, the driving frequency can be maintained.

When the phase difference data is 0 and the power comparison data is negative (–), the driving frequency can be increased by a particular value. Here, the particular value can be determined based on the target power and the measured power. For example, the particular value may be determined with an Equation (1)

$$\frac{|Pset - Pmea|}{Pset} \times f0 \qquad \text{Equation (1)}$$

Here, Pset means the target power, Pmea means the measured power, and f0 means a reference frequency. The reference frequency can be determined from 1 Hz to 1 kHz. As the reference frequency increases, time for the measured power to reach the target power may be shortened.

When the phase difference data is positive (+) and the power comparison data is positive (+), the driving frequency can be decreased by the particular value.

When the phase difference data is positive (+) and the power comparison data is 0, the driving frequency can be maintained.

When the phase difference data is positive (+) and the power comparison data is negative (–), the driving frequency can be increased by the particular value.

When the phase difference data is negative (–), the driving frequency can be increased by a fixed value regardless of the power comparison data. The central controller 500 may increase the driving frequency so that the phase difference data becomes positive (+) rather than negative (–). This is because, when the phase difference data is negative (–), hard switching may occur in switches in the inverter 130 which causes damage to the switches. In other words, in the plasma process, ZVS (Zero Voltage Switching) becomes possible as maintaining the phase difference data positive (+), so that damage of switches can be prevented.

Here, the fixed value can be relatively larger than the aforementioned particular value in order to quickly make the phase difference data positive (+). For example, the fixed value can be determined between 100 Hz and 100 kHz. However, if the fixed value becomes excessively large, the driving frequency is greatly changed and the change degree of impedance of the load also can be bigger which can result that the plasma stability is hindered.

The features, structures, effects, etc. described in the above embodiments are included in at least one embodiment of the present disclosure, but are not necessarily limited to only one embodiment. Further, the features, structures, effects, etc. exemplified in each embodiment may be combined or modified also in other embodiments by those skilled in the art to which the embodiment are pertained. Accordingly, configurations related to the combinations and modifications should be construed as being included in the range of the present disclosure.

Although the present disclosure was described above with reference to embodiments, the embodiments are only examples and do not limit the present disclosure, and those skilled in the art would know that the present disclosure may be changed and modified in various ways not exemplified above without departing from the scope of the present disclosure. That is, the components described in detail in the embodiments of the present invention may be modified. Further, differences relating to the changes and modifications should be construed as being included in the scope of the present invention which is determined by claims.

What is claimed is:

1. A system for plasma processing for multi station, the system comprising:
- a processing chamber including a first station and a second station;
- a first plasma generator coupled to the first station;
- a first inverter configured to provide AC power to the first plasma generator;
- a first sensing unit configured to sense electric characteristics related to the first plasma generator;
- a second plasma generator coupled to the second station;
- a second inverter configured to provide AC power to the second plasma generator;
- a second sensing unit configured to sense electric characteristics related to the second plasma generator; and
- a controller configured to control the first inverter and the second inverter,
- wherein the first plasma generator includes a first discharge tube fluidically coupled to the first station and a first antenna structure placed to surround the first discharge tube,
- wherein the second plasma generator includes a second discharge tube fluidically coupled to the second station and a second antenna structure placed to surround the second discharge tube,
- wherein the first antenna structure is configured to receive AC power from the first inverter and induce plasma inside the first discharge tube, and
- wherein the second antenna structure is configured to receive AC power from the second inverter and induce plasma inside the second discharge tube.

2. The system of claim 1,
- wherein the controller is configured to:
- provide a first switch signal corresponding to a first driving frequency to the first inverter based on first sensing data obtained from the first sensing unit, and
- provide a second switch signal corresponding to a second driving frequency to the second inverter based on second sensing data obtained from the second sensing unit.

3. The system of claim 2,
- wherein the controller is configured to:
- receive third sensing data after receiving the first sensing data,
- determine whether to change the first switch signal provided to the first inverter based on the third sensing data,
- receive fourth sensing data after receiving the second sensing data,
- determine whether to change the second switch signal provided to the second inverter based on the fourth sensing data.

4. The system of claim 3,
- wherein the controller is configured to:
- obtain first phase difference data and first power comparison data by using the third sensing data,
- determine whether to change the first switch signal provided to the first inverter by using the first phase difference data and the first power comparison data,
- wherein the first phase difference data corresponds to a phase difference between a voltage and a current applied to the first plasma generator, and
- wherein the first power comparison data corresponds to a difference between first power applied to the first inverter and first target power.

5. The system of claim 4,
- wherein the controller is configured to:
- provide a third switch signal corresponding to a third driving frequency smaller than the first driving frequency to the first inverter, when the first phase difference data indicates a lagging state and the first power comparison data indicates that the first power is smaller than the first target power.

6. The system of claim 5,
- wherein a difference between the first driving frequency and the third driving frequency is determined based on the first target power.

7. The system of claim 4,
- wherein the controller is configured to:
- maintain the first switch signal applied to the first inverter, when the first phase difference data indicates a lagging state and the first power comparison data indicates that the first power is same with the first target power.

8. The system of claim 4,
- wherein the controller is configured to:
- provide a third switch signal corresponding to a third driving frequency greater than the first driving frequency to the first inverter, when the first phase difference data indicates a lagging state and the first power comparison data indicates that the first power is greater than the first target power.

9. The system of claim 8,
- wherein a difference between the first driving frequency and the third driving frequency is determined based on the first target power.

10. The system of claim 4,
- wherein the controller is configured to:
- provide a third switch signal corresponding to a third driving frequency greater than the first driving frequency to the first inverter, when the first phase difference data indicates a leading state.

11. The system of claim 10,
- wherein a difference between the first driving frequency and the third driving frequency is a fixed value.

12. The system of claim 2,
- wherein the first sensing unit is configured to acquire the first sensing data at a first predetermined interval and provide the first sensing data to the controller, wherein the second sensing unit is configured to acquire the second sensing data at a second predetermined interval and provide the second sensing data to the controller, and wherein the controller is configured to:

change the first switch signal provided to the first inverter based on the first sensing data obtained periodically, such that a frequency of AC power provided to the first plasma generator changes to a third driving frequency from the first driving frequency, and change the second switch signal provided to the second inverter based on the second sensing data obtained periodically, such that a frequency of AC power provided to the second plasma generator changes to a fourth driving frequency from the second driving frequency.

13. The system of claim 12, wherein the controller is configured to:

obtain a first phase difference data representing a phase difference of a voltage and a current applied to the first plasma generator based on the first sensing data and the first switch signal, change the first switch signal provided to the first inverter when the first phase difference data does not satisfy a first allowable phase difference condition, obtain a second phase difference data representing a phase difference of a voltage and a current applied to the second plasma generator based on the second sensing data and the second switch signal, and change the second switch signal provided to the second inverter when the second phase difference data does not satisfy a second allowable phase difference condition.

14. The system of claim 13, wherein the first sensing data corresponds to a phase of the current applied to the first plasma generator and the first switch signal corresponds to a phase of the voltage applied to the first plasma generator, and wherein the second sensing data corresponds to a phase of the current applied to the second plasma generator and the second switch signal corresponds to a phase of the voltage applied to the second plasma generator.

15. The system of claim 1, further comprising:

a power distributor electrically coupled to the first inverter and the second inverter;

wherein the power distributor is configured to provide first DC power to the first inverter and provide second DC power different in magnitude from the first DC power to the second inverter.

16. The system of claim 1, wherein at least one of the first discharge tube or the second discharge tube include a non-conductive material or a material having thermal conductivity.

17. The system of claim 1, wherein at least one of the first plasma generator or the second plasma generator includes an electrode configured to DC discharge in the first discharge tube or the second discharge tube.

18. The system of claim 1, further comprising:

a robot arm coupled to the processing chamber and configured to move a process object to the first station or the second station.

19. The system of claim 1, wherein the first station includes a first head and a first substrate holder on which a first substrate is placed, the first head fluidically coupled to the first plasma generator.

20. The system of claim 1, further comprising:

a first gas supplier configured to provide gas to the first station and the second station; and a second gas supplier configured to provide the gas to at least one of the first plasma generator or the second plasma generator.

* * * * *